United States Patent
Hellberg

(10) Patent No.: US 9,906,193 B2
(45) Date of Patent: Feb. 27, 2018

(54) POWER AMPLIFIER FOR AMPLIFICATION OF AN INPUT SIGNAL INTO AN OUTPUT SIGNAL

(71) Applicant: TELEFONAKTIEBOLAGET L M ERICSSON (PUBL), Stockholm (SE)

(72) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/029,701

(22) PCT Filed: May 2, 2014

(86) PCT No.: PCT/SE2014/050544
§ 371 (c)(1),
(2) Date: Apr. 15, 2016

(87) PCT Pub. No.: WO2015/057123
PCT Pub. Date: Apr. 23, 2015

(65) Prior Publication Data
US 2016/0248382 A1    Aug. 25, 2016

(30) Foreign Application Priority Data
Oct. 18, 2013    (WO) .............. PCT/SE2013/051217

(51) Int. Cl.
H03F 1/02    (2006.01)
H03F 3/21    (2006.01)
(Continued)

(52) U.S. Cl.
CPC ......... *H03F 1/0288* (2013.01); *H03F 1/0277* (2013.01); *H03F 1/0294* (2013.01);
(Continued)

(58) Field of Classification Search
USPC ........... 330/124 R, 295, 302, 84, 286, 53–54
See application file for complete search history.

(56) References Cited

U.S. PATENT DOCUMENTS

| 6,252,461 B1 * | 6/2001 | Raab ............. H03F 1/0205 330/124 R |
| 2003/0076167 A1 | 4/2003 | Hellberg |

(Continued)

FOREIGN PATENT DOCUMENTS

| EP | 1677414 A1 | 7/2006 |
| EP | 2383883 A1 | 11/2011 |

(Continued)

OTHER PUBLICATIONS

Chireix, High Power Outphasing Modulation, Proceedings of the Institute of Radio Engineers, vol. 23, No. 2, pp. 1370-1392, Nov. 1935.

(Continued)

*Primary Examiner* — Hieu Nguyen

(57) ABSTRACT

A power amplifier comprising a first, a second and a third sub-amplifier for amplification of an input signal into an output signal. The sub-amplifiers are connected to an output network for providing the output signal at an output port of the output network. The output network comprises a first, a second and a third transmission line connected to the first sub-amplifier, the second sub-amplifier, and the third sub-amplifier, respectively. The first and second sub-amplifiers are operable in a first mode. The second and third sub-amplifiers are operable in a second mode. The first and third sub-amplifiers are operable in a third mode. Each of the first, second and third modes comprises a respective out-phasing mode in a respective part of an amplitude range of the power amplifier.

8 Claims, 28 Drawing Sheets

(51) Int. Cl.
*H03F 3/19* (2006.01)
*H03F 3/60* (2006.01)
*H03F 3/72* (2006.01)
*H04W 88/02* (2009.01)
*H04W 88/08* (2009.01)

(52) U.S. Cl.
CPC ............ *H03F 3/19* (2013.01); *H03F 3/211* (2013.01); *H03F 3/602* (2013.01); *H03F 3/72* (2013.01); *H04W 88/02* (2013.01); *H04W 88/08* (2013.01); *H03F 2200/111* (2013.01); *H03F 2200/408* (2013.01); *H03F 2200/423* (2013.01); *H03F 2200/451* (2013.01); *H03F 2203/7209* (2013.01)

(56) References Cited

U.S. PATENT DOCUMENTS

| | | |
|---|---|---|
| 2010/0117727 A1 | 5/2010 | Dawson et al. |
| 2011/0254629 A1 | 10/2011 | Hellberg |
| 2013/0099866 A1 | 4/2013 | Conradi |

FOREIGN PATENT DOCUMENTS

| | | |
|---|---|---|
| EP | 2403135 A1 | 1/2012 |
| WO | 200306115 A1 | 7/2003 |
| WO | 2004057755 A1 | 7/2004 |
| WO | 2005031966 A1 | 4/2005 |
| WO | 2007029119 A2 | 3/2007 |
| WO | 2007078217 A1 | 7/2007 |
| WO | 2010068152 A1 | 6/2010 |
| WO | 2013087232 A1 | 6/2013 |
| WO | 2014094824 A1 | 6/2014 |

OTHER PUBLICATIONS

Doherty, A New High Efficiency Power Amplifier for Modulated Waves, Proceedings of the Institute of Radio Engineers, vol. 24, No. 9, pp. 1163-1182, Sep. 1936.

Andersson, et al., A 44 dBm 1.0-3.0 GHz GaN Power Amplifier with over 45% PAE at 6 dB back-off, Proceedings IMS, 2013.

Andersson, et al., A 1-3 GHz Digitally Controlled Dual-RF Input Power Amplifier Design Based on a Doherty-Outphasing Continuum Analysis.

Gustafsson, et al., Theory and Design of a Novel Wideband and Reconfigurable High Average Efficiency Power Amplifier, Proceedings IMS, 2012.

Grebennikov, et al., High-Efficiency Doherty Power Amplifiers: Historical Aspect and Modern Trends, Proceedings of the IEEE, vol. 100, No. 12, pp. 3190-3219, Dec. 2012.

* cited by examiner

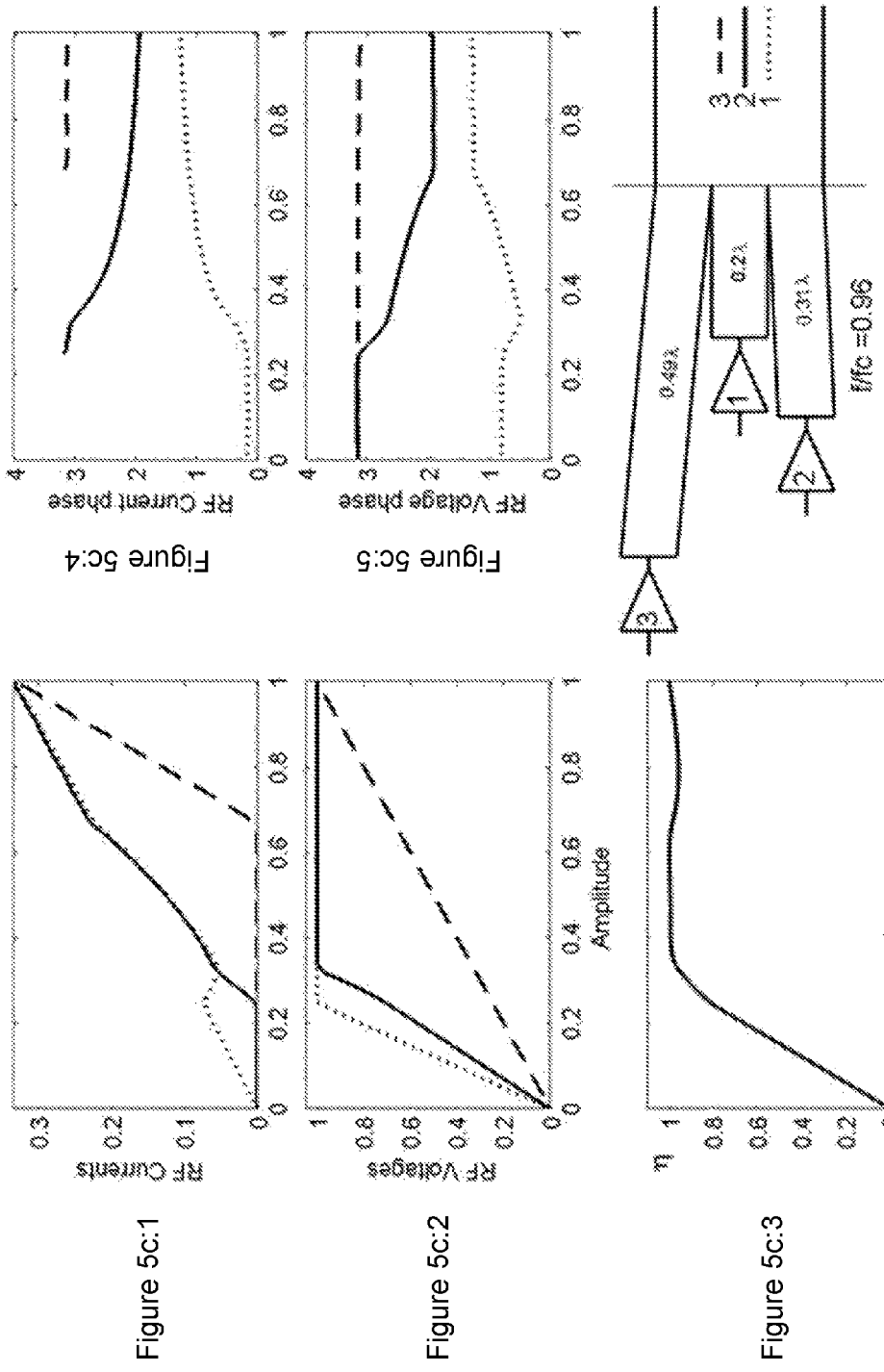

POWER AMPLIFIER FOR AMPLIFICATION OF AN INPUT SIGNAL INTO AN OUTPUT SIGNAL

This application is a 371 of International Application No. PCT/SE2014/050544, filed May 2, 2014, which claims the benefit of International Application No. PCT/SE2013/051217, filed Oct. 18, 2013, the disclosure of which is fully incorporated herein by reference.

TECHNICAL FIELD

Embodiments herein relate to wireless communication systems, such as telecommunication systems. In particular, a power amplifier for amplification of an input signal into an output signal is disclosed. Furthermore, a radio network node, comprising the power amplifier, and a user equipment, comprising the power amplifier, are disclosed.

BACKGROUND

Power amplifiers are widely used in communication systems, for example in radio base stations and cellular phones of a cellular radio network. In such cellular radio network, power amplifiers typically amplify signals of high frequencies for providing a radio transmission signal. A consideration in the design of power amplifiers is the efficiency thereof. High efficiency is generally desirable so as to reduce the amount of power that is dissipated as heat. Moreover, in many applications, such as in a satellite or a cellular phone, the amount of power that is available may be limited due to powering by a battery, included in e.g. the satellite. An increase in efficiency of the power amplifier would allow an increase of operational time between charging of the battery.

A conventional Power Amplifier (PA), such as class B, AB, F, has a fixed Radio Frequency (RF) load resistance and a fixed voltage supply. Class B or AB bias causes the output current to have a form close to that of a pulse train of half wave rectified sinusoid current pulses. The Direct Current (DC), and hence DC power, is largely proportional to the RF output current amplitude, and voltage. The output power, however, is proportional to the RF output current squared. An efficiency of the conventional power amplifier, i.e. output power divided by DC power, is therefore also proportional to the output amplitude. The average efficiency is consequentially low when amplifying signals that on average have a low output amplitude, or power, compared to the maximum required output amplitude.

Known RF power amplifiers include both Doherty and Chireix type power amplifiers. These kinds of RF PAs are generally more efficient than the conventional amplifier described above for amplitude-modulated signals with high Peak-to-Average Ratio (PAR), since they have a lower average sum of output currents from the transistors. Reduced average output current means high average efficiency.

The reduced average output current is obtained by using two transistors that influence each other's output voltages and currents through a reactive output network, which is coupled to a load. By driving the constituent transistors with the right amplitudes and phases, the sum of RF output currents is reduced at all levels except the maximum. Also for these amplifiers the RF voltage at one or both transistor outputs is increased.

Generally, RF power amplifier can be driven in a so called backed off operation. This means that the power amplifier is operated a certain level, e.g. expressed as a number of decibels (dBs), under its maximum output power. Backed off operation may also refer to that an instantaneous output power is relatively low.

Referring to FIG. 1, WO03/06111 discloses a composite power amplifier 10 including a first and a second power amplifier 11, 12 connected to an input signal over an input network and to a load $R_{LOAD}$ over an output network 13. The output network 13 includes a longer and a shorter transmission line 14, 15 for generating different phase shifts from each power amplifier output to the load $R_{LOAD}$. Each of the longer and shorter transmission lines 14, 15 connects each of the first and second amplifiers 11, 12 to a common output at the load $R_{LOAD}$. In order to achieve, for this composite power amplifier 10, a widest wideband operation, lengths of the longer and shorter transmission lines 14, 15 are chosen such that the longer transmission line 14 has an electrical length of half a wavelength at a center frequency of the composite amplifier 10, while the shorter transmission line 15 is a quarter wavelength long at the center frequency. The composite power amplifier may be operated, typically over a 3 to 1 bandwidth, in Doherty mode, in Chireix mode or in other intermediate modes between the Doherty and Chireix modes. Thus, the 3 to 1 bandwidth of high efficiency is achieved by devising an output network 13 that has both suitable impedance transformation characteristics and full power output capacity over the bandwidth. A continuous band of high efficiency amplification is thus achieved.

In FIG. 2, a simplified structure of the composite amplifier of FIG. 1 is shown. The shorter and longer transmission lines are shown as branches 21, 22 and the first and second amplifiers 11, 12 are connected to a respective branch 21, 22. The branches 21, 22 are connected to the load $R_{LOAD}$.

A drawback of the above mentioned composite power amplifier is that the efficiency for signals with high PAR, e.g. 10 dB, may for some applications not be sufficient.

Moreover, the above mentioned composite power amplifier may not always achieve high efficiency over a sufficiently wide bandwidth.

SUMMARY

An object is to improve a power amplifier, such as the composite power amplifier of the above mentioned kind.

According to an aspect, the object is achieved by a power amplifier comprising a first and a second sub-amplifier for amplification of an input signal into an output signal. The first and second sub-amplifiers are connected to an input network for receiving the input signal at an input port of the input network, and the first and second sub-amplifiers are connected to an output network for providing the output signal at an output port of the output network. The output network comprises a first transmission line and a second transmission line connected to the first sub-amplifier and the second sub-amplifier, respectively. Furthermore, the power amplifier comprises a third sub-amplifier for amplification of the input signal into the output signal. The third sub-amplifier is connected to the input network and the output network. The output network further comprises a third transmission line connected to the third sub-amplifier. The first and second sub-amplifiers are operable in a first mode. The second and third sub-amplifiers are operable in a second mode. The first and third sub-amplifiers are operable in a third mode, wherein each of the first, second and third modes comprises a respective out-phasing mode in a respective part of an amplitude range of the power amplifier.

According to another aspect, the object is achieved by a radio network node, comprising the power amplifier.

According to a further aspect, the object is achieved by a user equipment, comprising the power amplifier.

Hence, according to some exemplifying embodiments herein, multistage amplifiers with high efficiency operation for high PAR values in moderately wide bandwidths, as compared to the prior art solutions, are provided.

The moderately wide bandwidths are obtained by the output network, e.g. comprising the above mentioned first, second and third sub-amplifiers. The output network may provide multiple frequency regions, e.g. modes of operation, thanks to combinations of electrical length asymmetries among the first, second and third transmission lines. The modes of operation comprise partial Chireix-type modes in the multiple frequency regions.

In some embodiments, the output network is configured such as to provide an asymmetrical frequency response. The asymmetry arises from that transmission line lengths are changed to improved efficiency at on side of the frequency response, while worsening the other side. These amplifiers are described in more detail below.

As a result, the above mentioned object is achieved in that high efficiency for moderately wide bandwidths in back off operation may be obtained.

Advantageously, some embodiments herein provide universal, moderately wideband, high efficiency power amplifiers. The amplifier according to some embodiments herein may also be used without redesign or trimming for many different bands of operation. For example, moderately wideband may be in a range from 1.67 to 1 upto 3 to 1.

Moreover, the amplifier according to some embodiments herein may be designed to have high efficiency, especially in backed off operation or for high PAR input signals.

BRIEF DESCRIPTION OF THE DRAWINGS

The various aspects of embodiments disclosed herein, including particular features and advantages thereof, will be readily understood from the following detailed description and the accompanying drawings, in which:

FIGS. 5a-5e illustrate currents, voltages, and corresponding phases as well as amplitude for each of the sub-amplifiers for input signals at respective portion of the center frequency for an exemplifying power amplifier.

DETAILED DESCRIPTION

Figure 1:
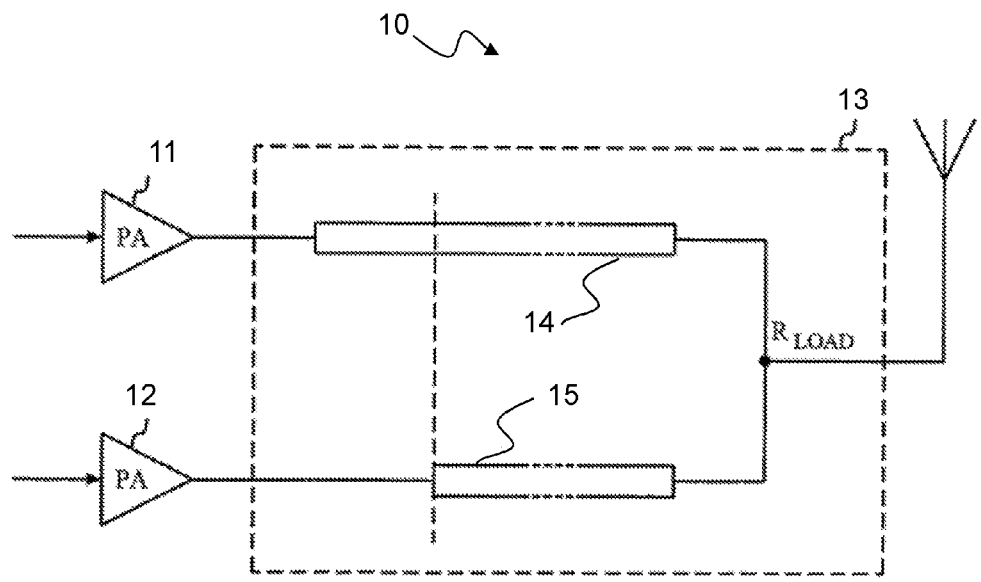
FIG. 1 is a schematic overview of a power amplifier according to prior art.
Figure 2:
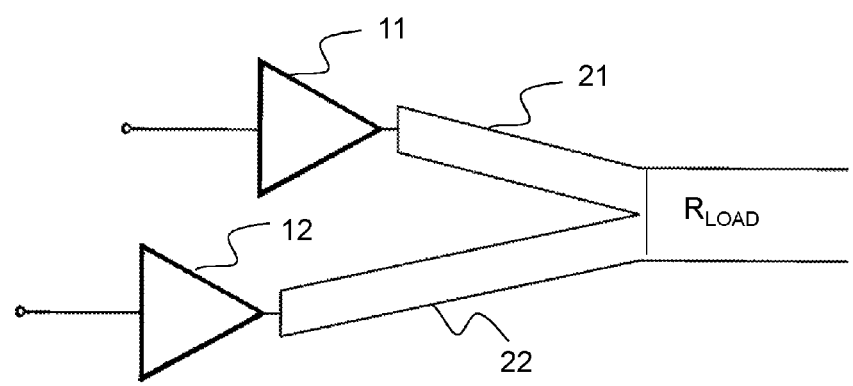
FIG. 2 is a schematic simplified overview of the power amplifier according to FIG. 1.

Throughout the following description similar reference numerals have been used to denote similar elements, units, modules, circuits, nodes, parts, items or features, when applicable. In the Figures, features that appear in some embodiments are indicated by dashed lines.

Figure 3:
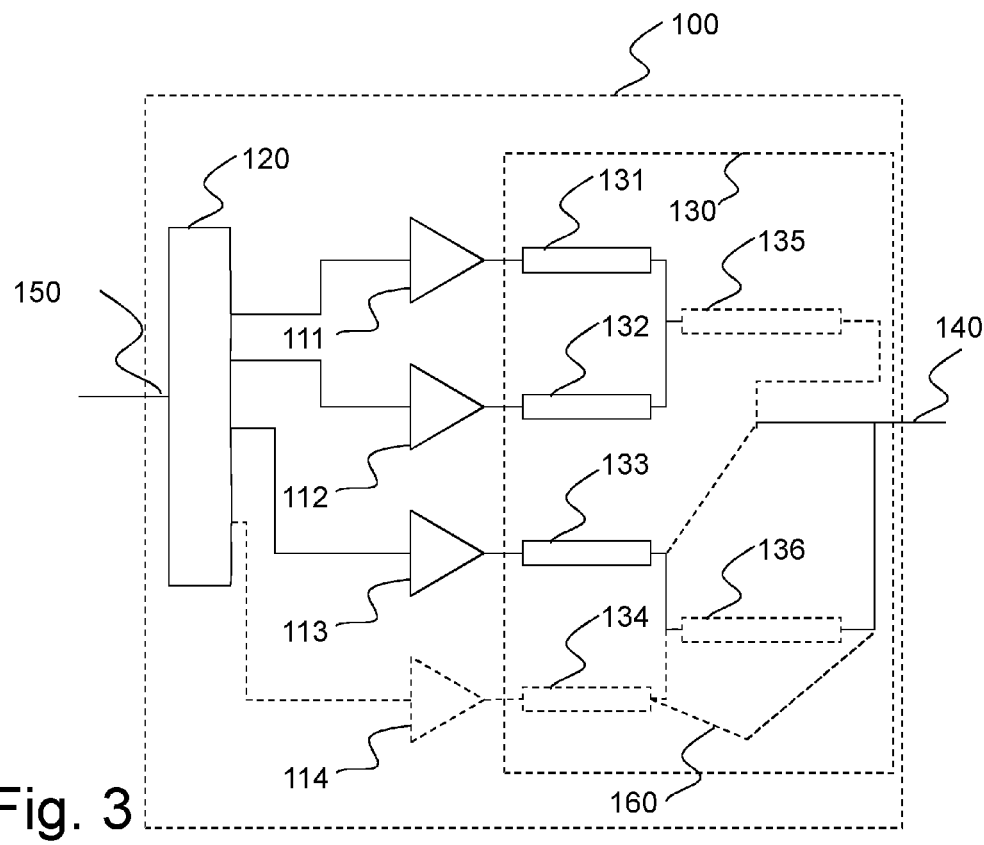
FIG. 3 is a schematic overview of the power amplifier according to embodiments herein.

FIG. 3 depicts an exemplifying power amplifier 100 according to embodiments herein. The power amplifier 100 comprises a first, a second and a third sub-amplifier 111, 112, 113 which are operated to amplify an input signal into an output signal.

The first, second and third sub-amplifiers 111, 112, 113 are connected to an input network 120 for receiving the input signal at an input port 150 of the input network 120. As an example, the input network 120 may include connections (not shown) for driving of each of the first, second and third sub-amplifiers 111, 112, 113.

Moreover, the first, second and third sub-amplifiers 111, 112, 113 are connected to an output network 130 for providing the output signal at an output port 140 of the output network 130.

The output network 130 comprises a first transmission line 131, a second transmission line 132 and a third transmission line 133 connected to the first sub-amplifier 111, the second sub-amplifier 112 and the third sub-amplifier 113, respectively.

The first and second sub-amplifiers 111, 112 are operable in a first mode. Furthermore, the second and third sub-amplifiers 112, 113 are operable in a second mode. The first and third sub-amplifiers 111, 113 are operable in a third mode. Each of the first, second and third modes comprises a respective out-phasing mode in a respective part of an amplitude range of the power amplifier 100. The term "out-phasing mode" is used to refer to two amplifiers, such as any pair of amplifiers stated to be in one of the first, second and third modes above, which are operating at maximum voltage, for which a change in their combined output depends only on change in phase difference between these two amplifiers.

In more detail, the first and second sub-amplifiers 111, 112 may be operable in the first mode at a first frequency range. The second and third sub-amplifiers 112, 113 may be operable in the second mode at a second frequency range. The first and third sub-amplifiers 111, 113 may be operable in the third mode at a third frequency range.

This may mean that the power amplifier 100 may be said to be operable in the first mode, the second mode and the third mode, wherein each of the first, second and third modes may be a so called at least partial Chireix-mode.

Continuing with the example with the first, second and third frequency ranges for each of the first, second and third mode, the power amplifier may be configured to be driven in the first mode at the first frequency, in the second mode at the second frequency and in the third mode at the third frequency. Notably, the second and third frequency ranges may follow subsequent to the first frequency range in increasing order. This means that the first, second and third frequency ranges may be different from each other.

Since the first, second and third sub-amplifiers 111, 112, 113 co-operate in the respective out-phasing modes, the power amplifier 100 may be referred to as a composite power amplifier.

The power amplifier 100 may be operable, e.g. efficiency of the power amplifier 100 may be above a threshold value, in a certain operating range. In some examples, the power amplifier 100 may be operable over a continuous bandwidth, e.g. range of frequencies. It may be that the operating range comprises one or more of the first, the second and the third frequency range.

The expression "operable in the certain operating range" shall be understood as having a margin. The margin will for example depend on the threshold value for when the efficiency may be considered to be good.

The threshold value, e.g. for when to consider the efficiency good, may be 60%. The threshold value is usually in the range from 30% to about 70%. The lower the threshold value is set, the wider the operating range, or an operational bandwidth of the power amplifier 100, may typically be. In further embodiments, the threshold value may even be outside the above mentioned range. This will be explained for some embodiments with reference to e.g. FIG. 9.

Each of the first, second and third modes may be different from a pure Doherty mode across an operational bandwidth of the power amplifier 100. This is illustrated in more detail e.g. with reference to FIG. 5a-5e.

Furthermore, the first and second transmission lines 131, 132 may be connected to a first common transmission line 135, included in the output network 130, wherein the first common transmission line 135 may be common to the first and second sub-amplifiers 131, 132. This embodiment is exemplified in connection with FIGS. 8 and/or 10 below.

The power amplifier 100 may further comprise a fourth sub-amplifier 114, wherein the fourth sub-amplifier 114 may be connected to the input network 120 and the output network 130, wherein the output network 130 may further comprise a fourth transmission line 134. This embodiment is described with reference to FIG. 21 below.

The third and fourth sub-amplifiers 133, 134 may be connected to a second common transmission line 136, included in the output network 130, wherein the second common transmission line 136 may be common to the third and fourth sub-amplifiers 133, 134.

In order to maintain or only moderately reduce, for example compared to WO03/06111, efficiency of the power amplifier 100 at maximum output power, i.e. available output power, the first, second and third sub-amplifier 111, 112, 113 are driven, across the operational bandwidth, such that the output signal is obtained by in-phase combining of respective output signals from the first, second and third sub-amplifier 111, 112, 113, respectively. The maximum output power refers to maximum output power from each respective sub-amplifier.

Figure 4:
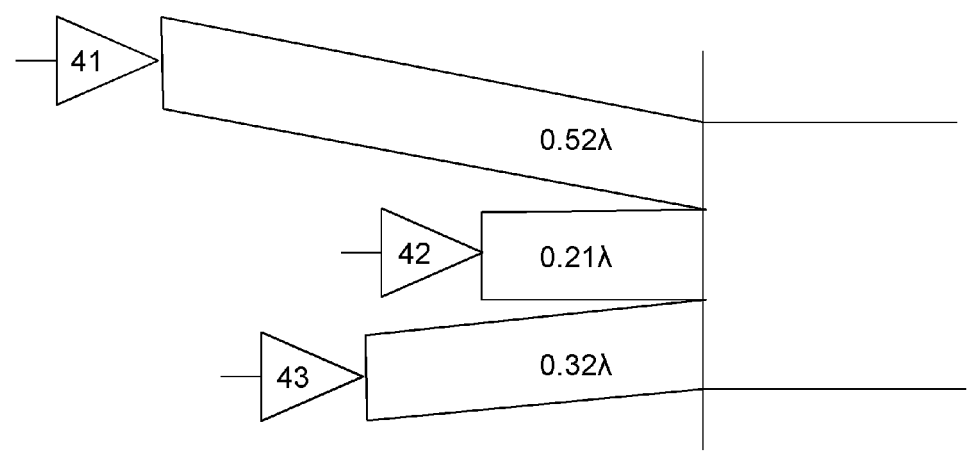
FIG. 4 is a schematic simplified overview of the power amplifier according to embodiments herein.

As a first example, FIG. 4 shows a three-stage power amplifier with a 2.5-to-1 bandwidth of very high average efficiency. The amplifier comprises three sub-amplifiers 41, 42, 43 connected via transmission lines to the output. The sub-amplifiers 41, 42, 43 may be power transistors with accompanying input match, bias and output match.

Since the electrical length of a transmission line is proportional to both frequency and physical length, the physical lengths of the transmission lines are here given as electrical length at center frequency. The electrical lengths of the transmission lines from respective sub-amplifier are in this case 0.21, 0.32 and 0.52 wavelengths at center frequency. The electrical lengths of the output matching networks are included in the electrical lengths, as given in the figures, of the transmission lines.

The electrical length of the output matching network can be different depending on the frequency range to be covered. The minimum electrical length of an output matching network with a certain bandwidth is largely determined by the capacitance at the output node of the transistor, which can be "absorbed" into a suitable network. The length of the transmission lines (or equivalent) must then be reduced by the same amount.

Essentially all transmission lines in the examples can be replaced by combinations of lumped elements. For example, the quarterwave lines can be replaced by LC pi- or T-networks with reactances equal in magnitude to the characteristic impedance of the replaced quarterwave line. T networks, L networks, single or in cascade can also be used.

A wideband method to get high efficiency and low harmonic content directly at the sub-amplifier is to use a push-pull arrangement of class B driven transistors, e.g. two per sub-amplifier. A single-ended, e.g. one transistor per sub-amplifier, simpler but less efficient, wideband alternative is to use class A with dynamically amplitude-following gate bias to eliminate excess DC current.

An example is to use a wideband resistive termination outside the output network, for example by use of a wideband isolator before a bandpass filter. See e.g. C. Andersson et al., "A 44 dBm 1.0-3.0 GHz GaN Power Amplifier with over 45% PAE at 6 dB back-off", Proc. IMS 2013, or C. Andersson et al., "A 1-3 GHz digitally controlled dual-RF input power amplifier design based on a Doherty-Outphasing continuum analysis". It is then enough to change the bandpass filter to adapt the power amplifier for use at different operation frequencies. If the operation is limited to range smaller than 2 to 1, with some margin, single-ended class B operation can be used, since the second and higher harmonics can then be terminated in a low impedance also for the lowest frequencies in the used band. Combinations of the above methods may also be used, for example resistive termination in the lower part of the band, and class B termination in the upper part.

Figure 5A:
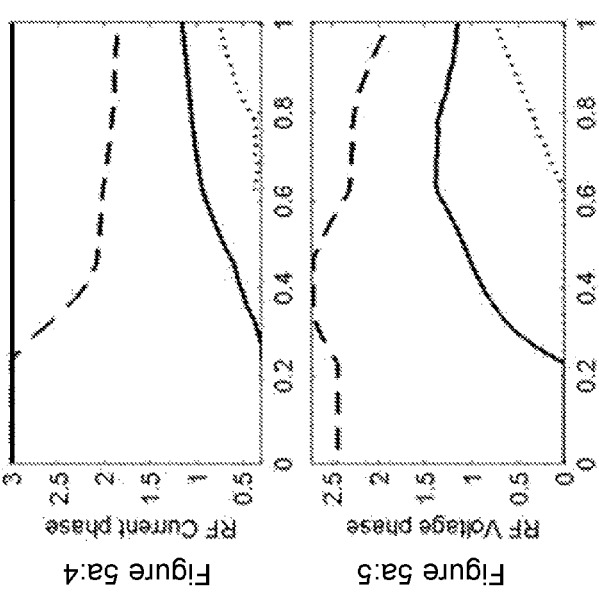
Figure 5A:
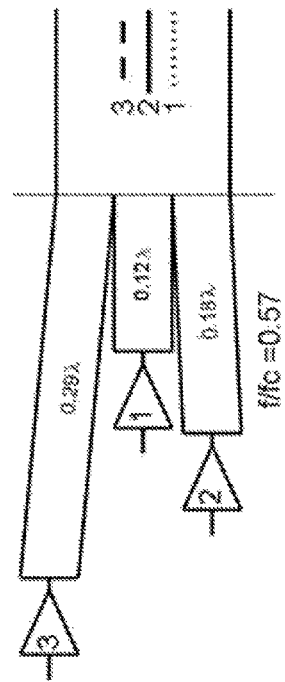
Figure 5A:
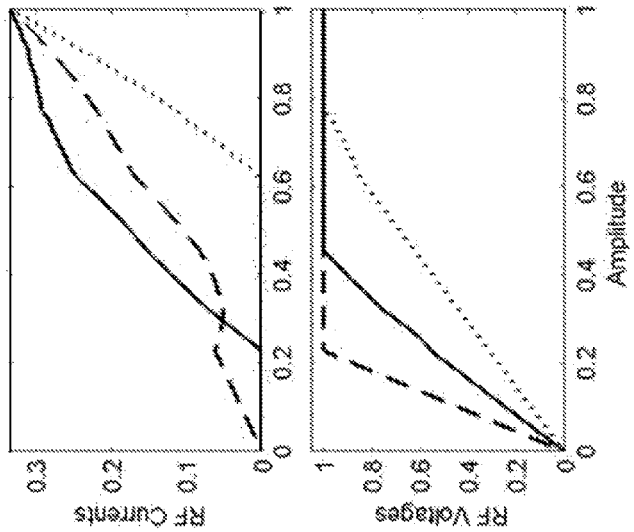
Figure 5A:
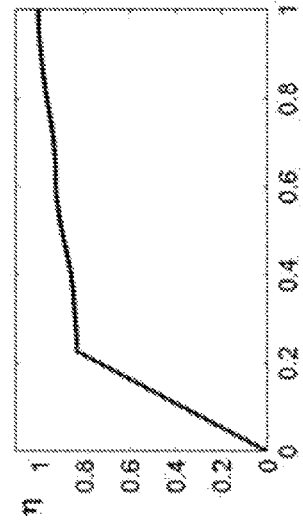
Figure 5B:
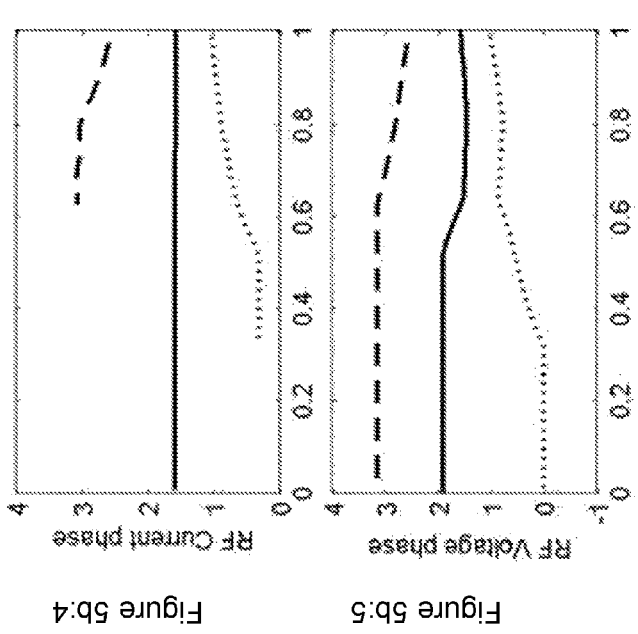
Figure 5B:
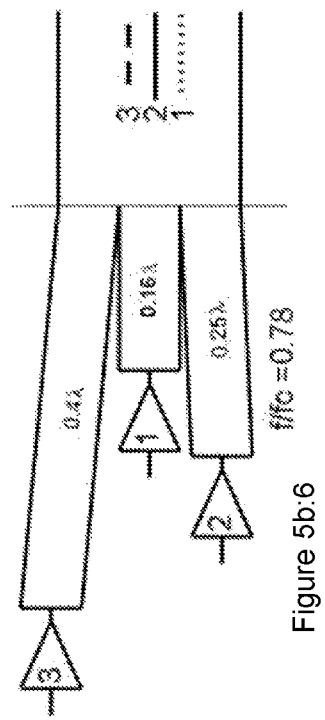
Figure 5B:
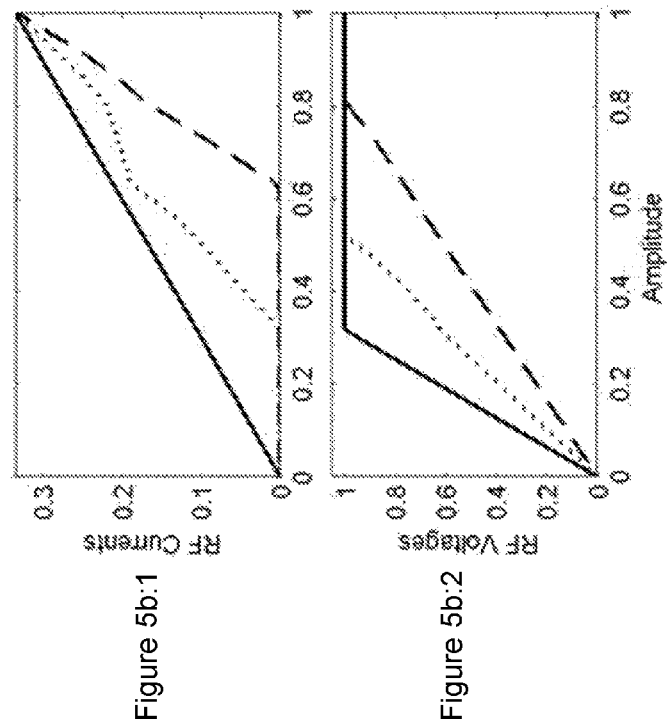
Figure 5B:
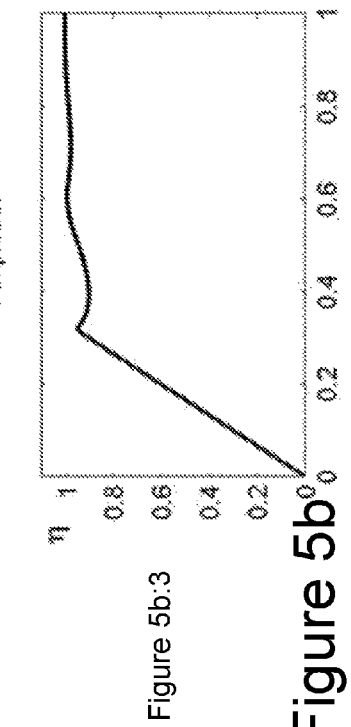
Figure 5D:
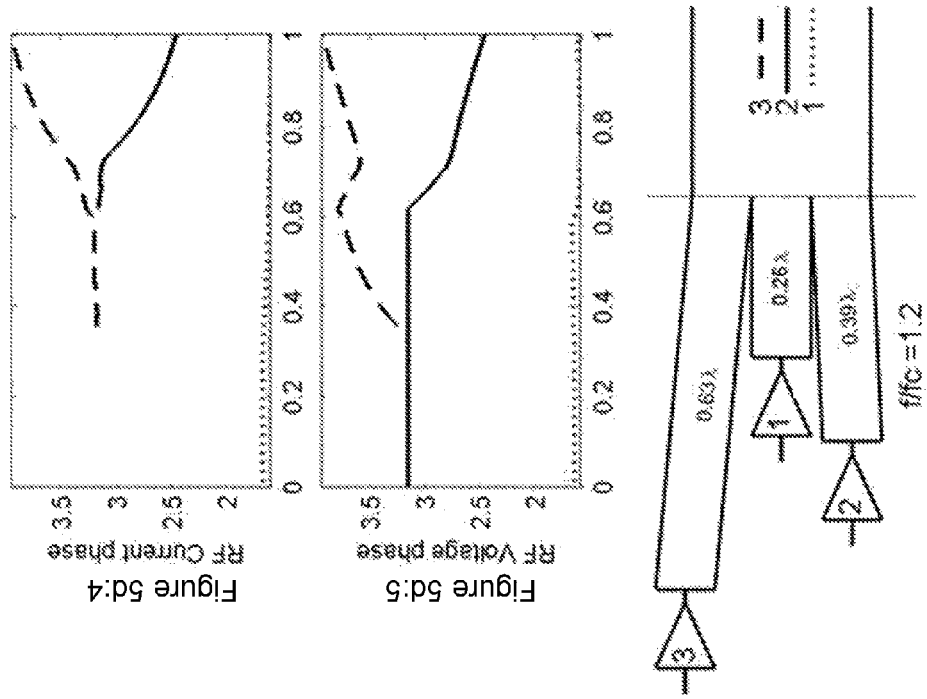
Figure 5D:
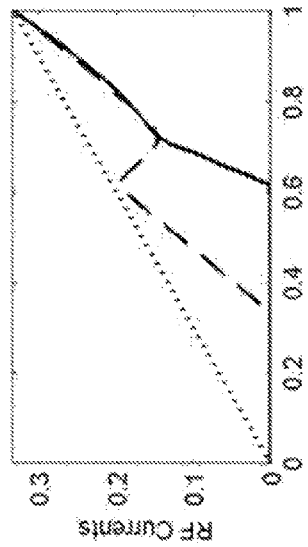
Figure 5D:
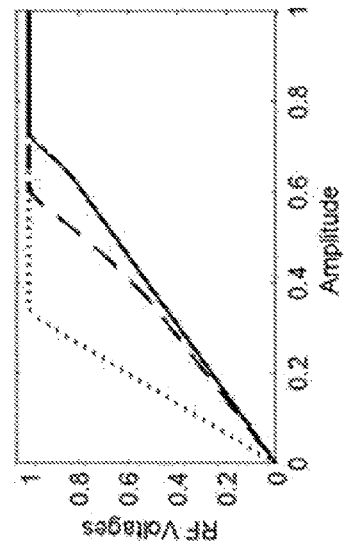
Figure 5D:
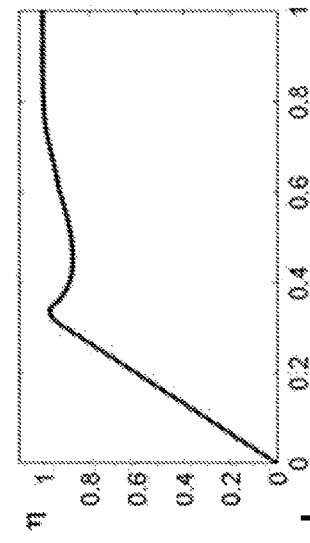

FIGS. 5a-5c show examples of operation of the exemplary power amplifier 101 of FIG. 4 at various frequencies within one half of a 2.5-to-1 bandwidth. The other half is a mirror image; even symmetry for the amplitudes and odd for the phases. For the 2.5-to-1 bandwidth to be centered at 1, it must go from about 0.57 to 1.42, so the lowest frequency supported is 0.57 times the center frequency. In these Figures, the first sub-amplifier 111 is represented by a dotted line, the second sub-amplifier 112 is represented by a solid line and the third sub-amplifier 113 is represented by a dashed line. As is seen in the Figures, the first, second and third modes may be different from each other at different frequencies and/or amplitudes.

Now referring in detail to FIG. 5a, which comprises six smaller FIGS. 5a:1-5a:6, each of these smaller Figures will be described. In order to understand the context of these Figures, FIG. 5a:6 is described first.

Thus, FIG. 5a:6 illustrates, beginning at the top of FIG. 5a:6, the third transmission line 133 with an electrical length of 0.29λ at 0.57 times the center frequency $f_c$, since 0.57*0.5=0.285=~0.29. Similarly, the first and second transmission lines 131, 132 have electrical lengths of 0.12λ, and 0.18λ, respectively for this frequency, i.e. at 0.57*$f_c$.

From FIG. 5a:1, it may be seen that the third sub-amplifier 113 is operated as a primary sub-amplifier at this frequency and for amplitudes up to about 0.2. This means that the third sub-amplifier 113 outputs a current that is greater than any respective currents from the first and second sub-amplifiers 111, 112. Moreover, it may also be seen that the second sub-amplifier 112 is not contributing at all up to about amplitudes of about 0.2.

FIG. 5a:2 shows RF voltage as a function of amplitude when operating the power amplifier 101 at 0.57*$f_c$. This Figure shows, e.g., that all sub-amplifiers 111, 112, 113 are saturated for amplitudes above about 0.8. Moreover, the third sub-amplifier 113 increases voltage faster than the first and second sub-amplifiers 111, 112.

FIG. 5a:3 shows total efficiency for all sub-amplifiers 111, 112, 113 as a function of amplitude when operating the power amplifier 101 at 0.57*$f_c$. This Figure shows, e.g., that total efficiency increases linearly up to an amplitude of about 0.2.

FIG. 5a:4 shows RF current phase as a function of amplitude when operating the power amplifier 101 at 0.57*$f_c$. This Figure shows, e.g., that the third sub-amplifier has the highest current phase over all amplitudes. This depends on that the third sub-amplifier has the longest electrical length towards the output port and the phase of the current compensates for this. A positive phase means ahead, or before, in time. If all phases are greater than 2*pi (2*3.1415 . . . ), it can be reduced with 2*pi in a narrowband perspective.

FIG. 5a:5 shows RF voltage phase as a function of amplitude when operating the power amplifier 101 at 0.57*$f_c$. This Figure shows, e.g., that the third sub-amplifier has the highest voltage phase over all amplitudes. Similarly to FIG. 5a:4, this depends on that the third sub-amplifier has the longest electrical length towards the output port and the phase of the voltage compensates for this. A positive phase means ahead, or before, in time. If all phases are greater than 2*pi (2*3.1415 . . . ), it can be reduced with 2*pi in a narrowband perspective.

A Chireix-Doherty mode, Chireix operation of two sub-amplifiers at low amplitudes, followed by Doherty "peaking" operation of the third sub-amplifier in the highest amplitude range, is found at 0.96 of center frequency, see FIG. 5c. Doherty-Chireix modes, Doherty "main" operation of one sub-amplifier at low amplitudes, with the other two in Chireix operation as peaking amplifiers in the high amplitude range, are found at 0.8 and 1.2 of center frequency. See FIGS. 5b and 5d, respectively.

Figure 5E:
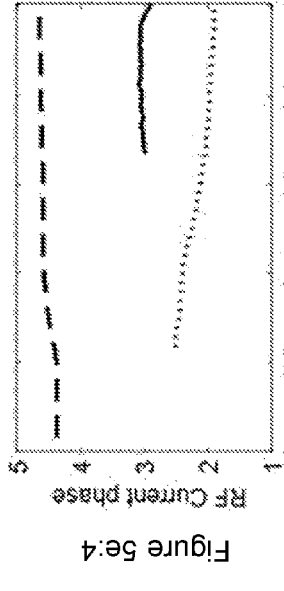
Figure 5E:
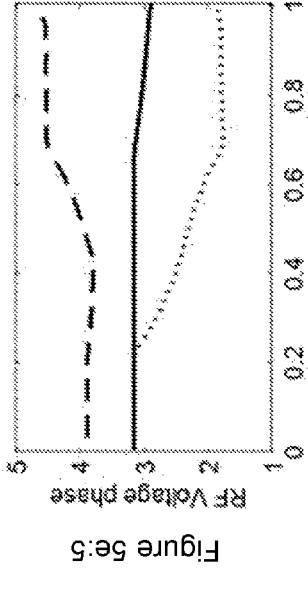
Figure 5E:
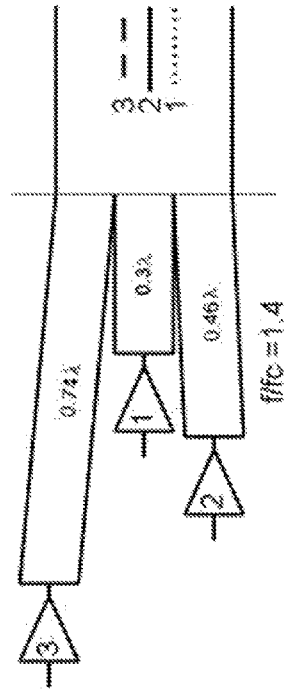
Figure 5E:
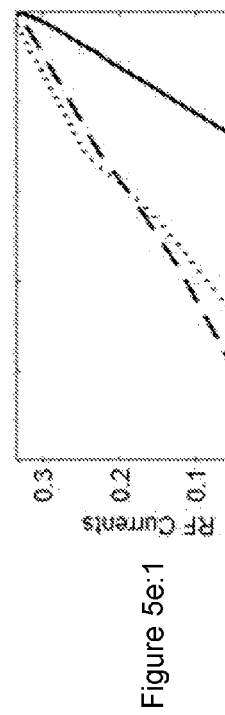
Figure 5E:
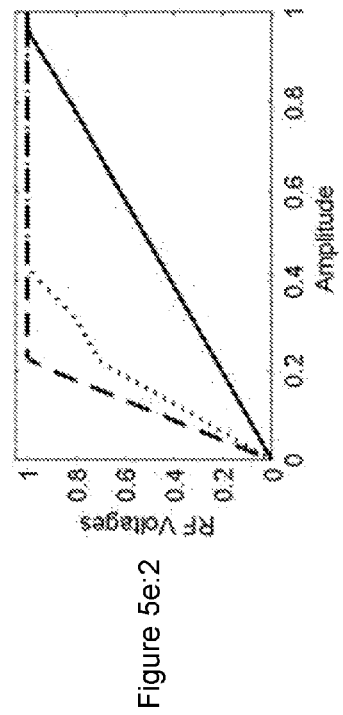
Figure 5E:
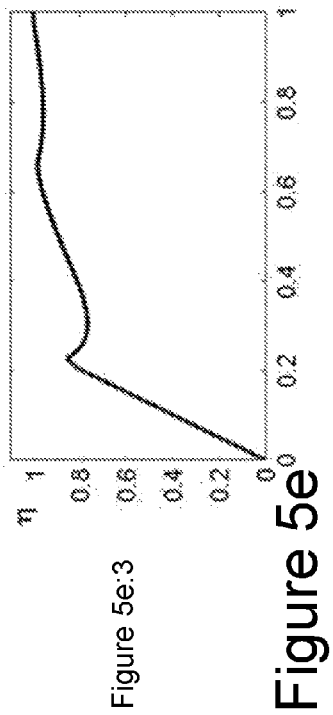

At other frequencies the modes are not as pure, but at the lowest and highest frequencies in the band, towards 0.57 of center frequency and 1.43 of center frequency, the operation modes are close to Chireix-Doherty as in FIGS. 5a and 5e, respectively.

The operational modes determine the shape of the efficiency curve, and a larger proportion of Chireix-like operation give rounded efficiency peaks with less drop in-between. The efficiency curve rises to a high value at a fairly low amplitude if the average efficiency for high PAR signals is desired to be good.

As can be observed above with reference to FIGS. 5a-5e, the RF output currents of the transistors, referred to as sub-amplifiers above, and the RF voltages are thus as follows, from low to high amplitudes:

1) One transistor delivers all RF current, linearly increasing with amplitude and with a constant phase relative to the output. All voltages are below saturation and breakdown limits. Efficiency is in this region proportional to the amplitude and to the trans-impedance from the driven transistor to the output. This region continues until one transistor voltage reaches a limit.

2) One transistor is voltage-limited. Two transistors deliver RF current. Their phases relative to the output generally change with amplitude. This continues until two transistors are voltage limited.

3) Two transistors are voltage limited, often similar to what is called "out-phasing" in a symmetric 2-transistor Chireix amplifier, with increasing RF current amplitudes. This continues until it is more efficient to start a third transistor, not necessarily where the possibility of out-phasing ends.

4) Two transistors voltage limited with a third transistor also delivering RF current, and not voltage limited.

5), and so on . . . .

Figure 6:
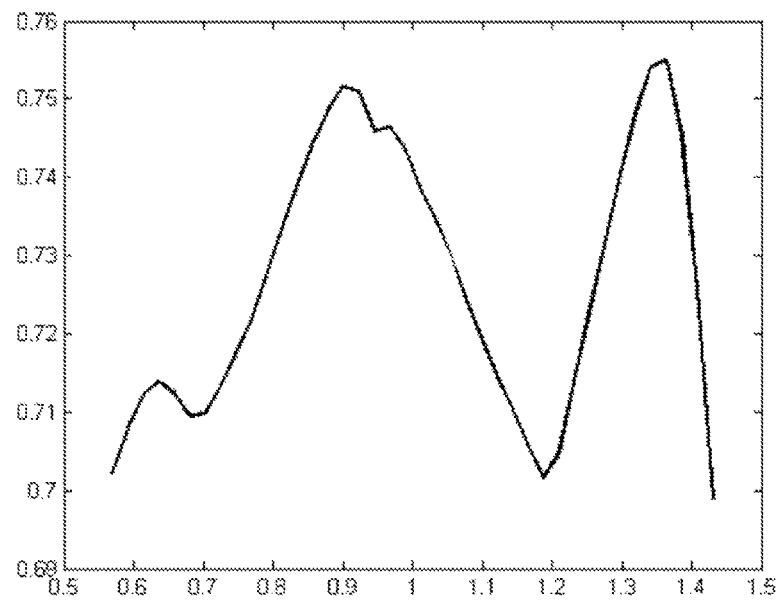
FIG. 6 illustrates average efficiency of the power amplifiers according to some embodiments over a 2.5 to 1 bandwidth for a signal with 7 dB PAR Rayleigh distributed amplitude.

The class B efficiency for a signal with 7 dB PAR Rayleigh distributed amplitude is 70% or higher in the 2.5-to-1 frequency range is shown in FIG. 6.

Figure 7:
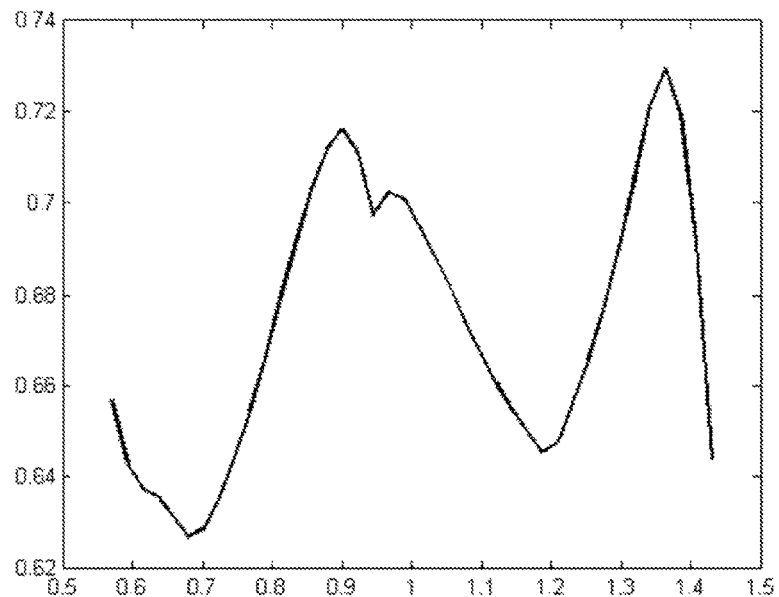
FIG. 7 illustrates average efficiency of the power amplifiers according to some embodiments over a 2.5 to 1 bandwidth for a signal with 10 dB PAR Rayleigh distributed amplitude.

The class B efficiency for a signal with 10 dB PAR Rayleigh distributed amplitude is 62% or higher in the 2.5-to-1 frequency range is shown in FIG. 7. The bandwidth range is actually somewhat greater, since the lowest efficiency points are not at the right most and left most points of the graph shown.

Figure 8:
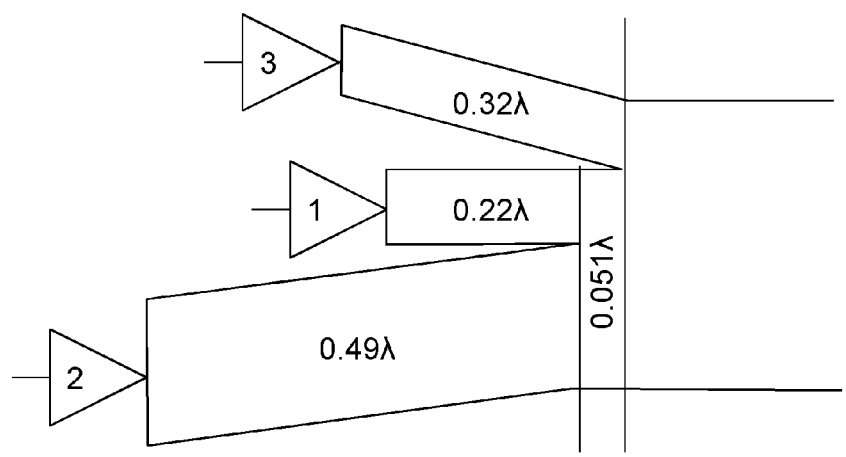
FIG. 8 is a schematic simplified overview of the power amplifier according to some embodiments herein.

FIG. 8 illustrates an exemplifying power amplifier with a structure with a trunk line from the connection point of two of the lines from the sub-amplifiers to the output. Moreover, different sizes for the different amplifiers are used (though not shown in the Figure) in this example. For example, the power amplifier may have one amplifier twice the size of the two other.

As an example of both these features, an amplifier in which sub-amplifiers 1 and 3 have half the size of amplifier 2 (and the lines from amplifiers 1 and 3 consequentially having twice the characteristic impedance of the line from amplifier 2). Amplifiers 1 and 2 are connected via lines of length 0.22 and 0.49 wavelengths (at center frequency) to a trunk line of 0.051 wavelengths, that is coupled to the output. Amplifier 3 is coupled via a line that is 0.32 wavelengths at center frequency.

Figure 9:
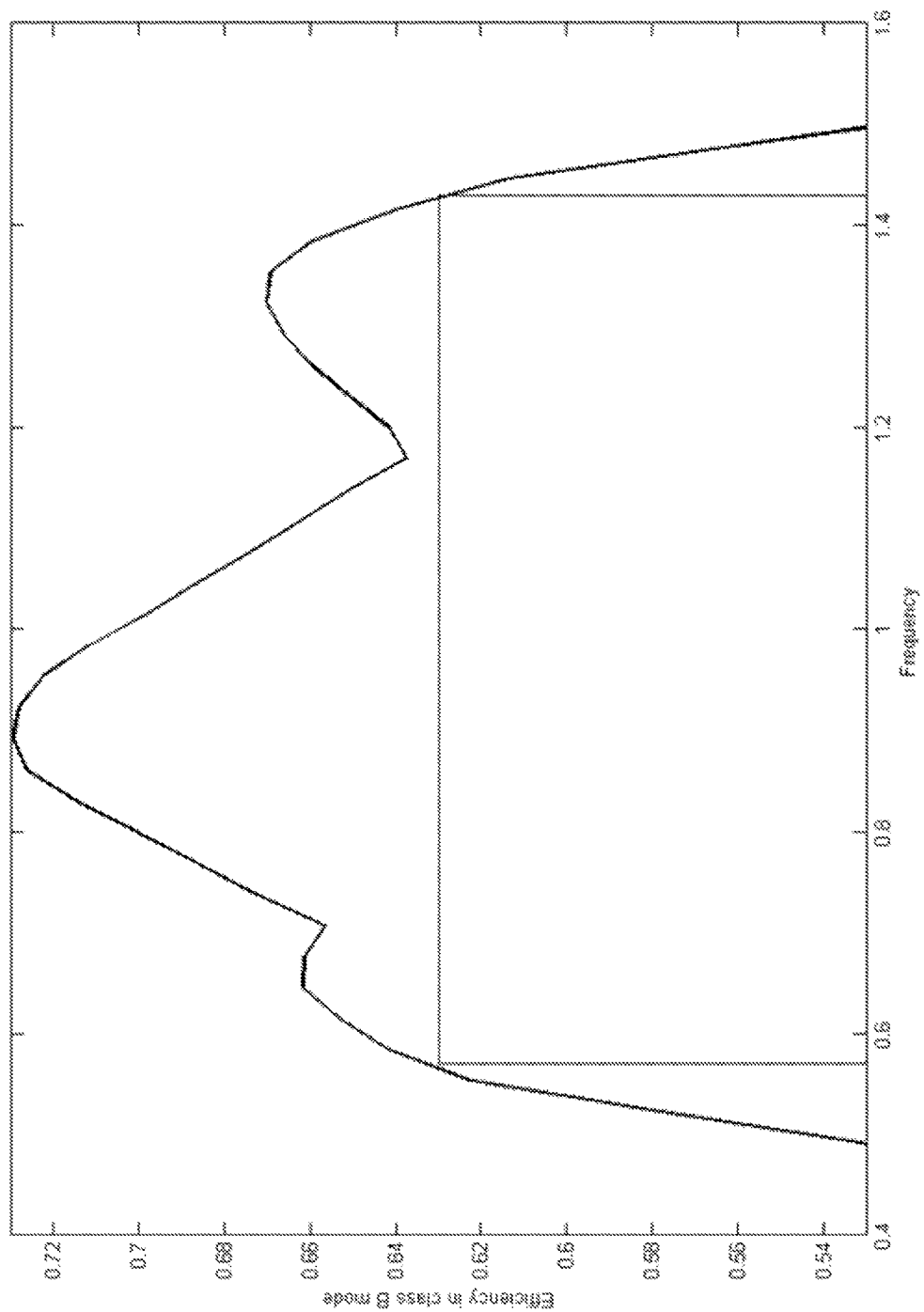
FIG. 9 illustrates efficiency versus frequency for exemplifying power amplifiers according to some embodiments.

The theoretical efficiency, i.e. above 63%, in class B mode for 10 dB PAR signals over a frequency range of 2.5 to 1 is shown in FIG. 9.

Figure 10:
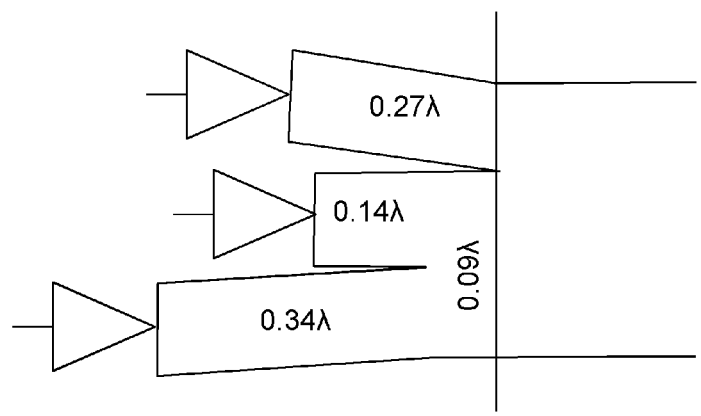
FIG. 10 is a schematic simplified overview of the power amplifier according to some embodiments herein.

In a further three-stage example, an amplifier with 55% relative bandwidth of high efficiency is shown in FIG. 10.

The operating modes are Chireix-Doherty-like around 0.8 and 1.15 of center frequency, and Doherty-Chireix-like around 0.95 of center frequency.

Figure 11:
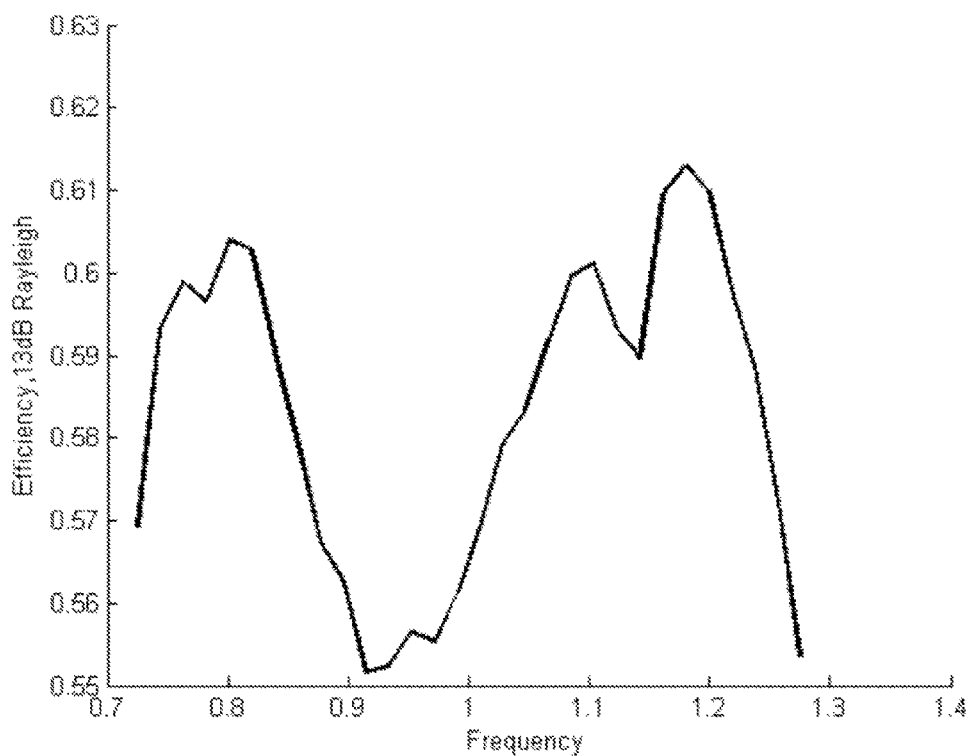
FIG. 11 illustrates efficiency versus frequency for exemplifying power amplifiers according to some embodiments.

The resulting average efficiency for a 13 dB Rayleigh distributed signal over the 55% relative bandwidth is shown in FIG. 11.

Figure 12:
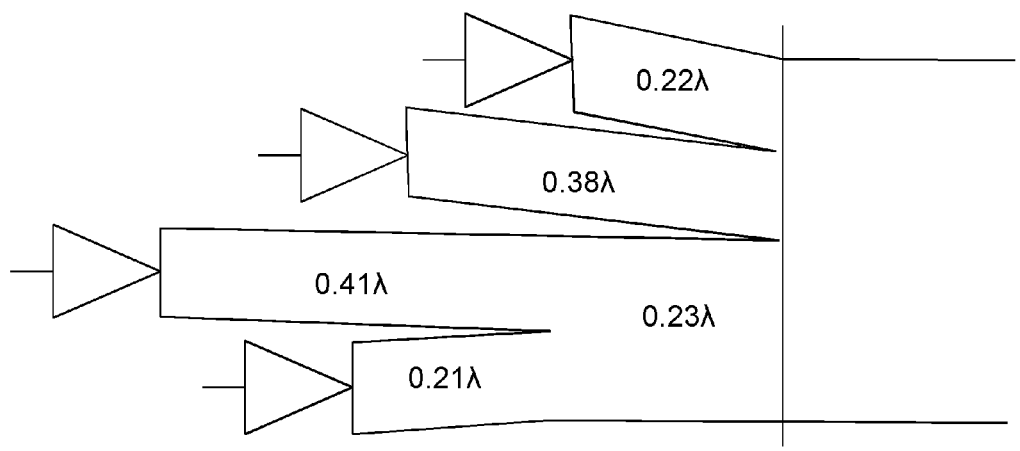
FIG. 12 is another schematic simplified overview of the power amplifier according to some embodiments herein.
Figure 13A:
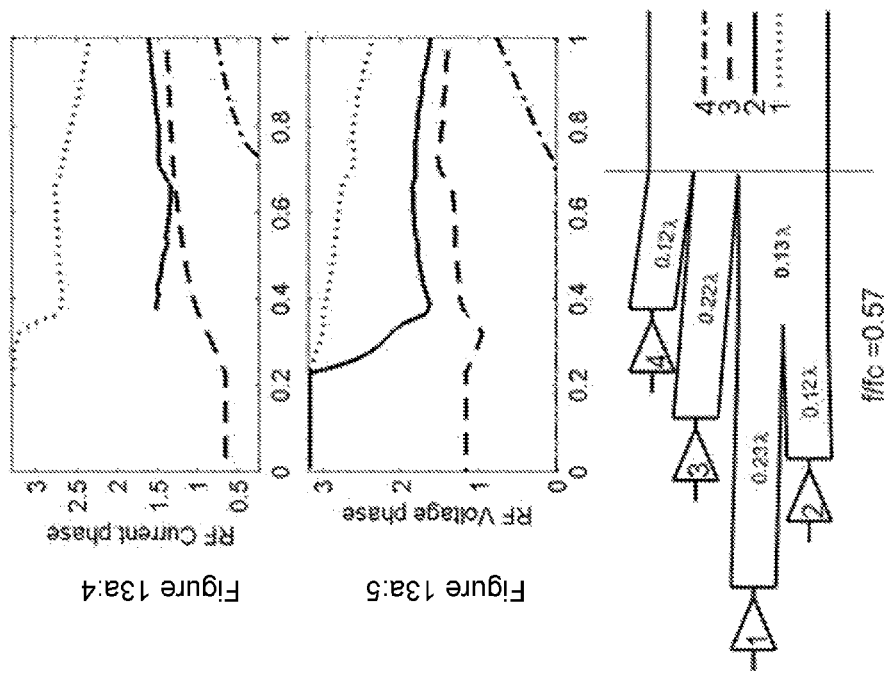
FIG. 13a-13e illustrate currents, voltages, and corresponding phases as well as amplitude for each of the sub-amplifiers for input signals at respective portion of the center frequency for a further exemplifying power amplifier.
Figure 13A:
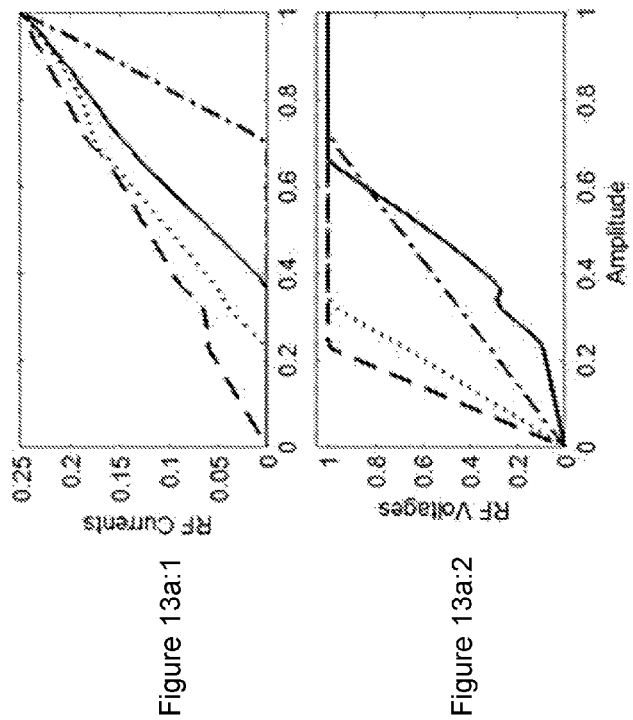
Figure 13A:
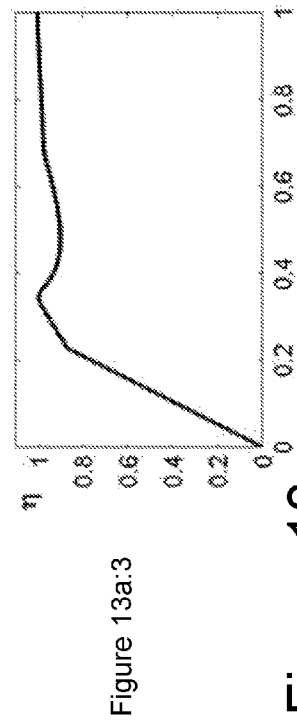
Figure 13B:
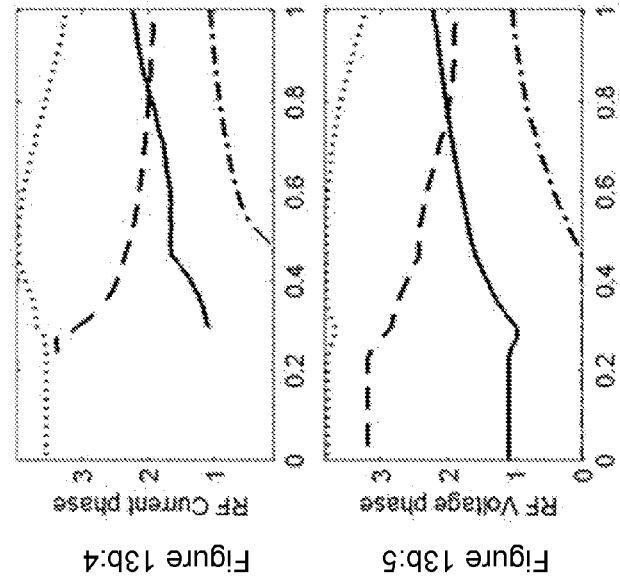
Figure 13B:
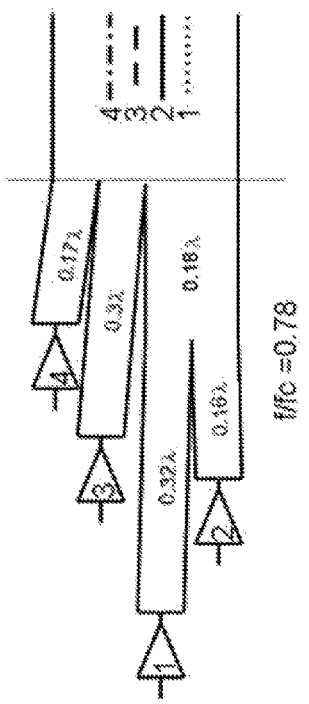
Figure 13B:
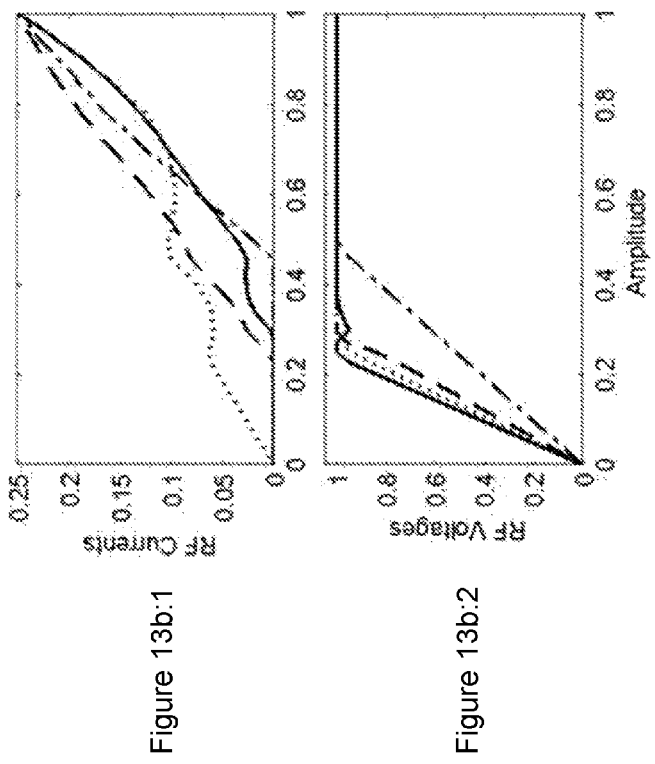
Figure 13B:
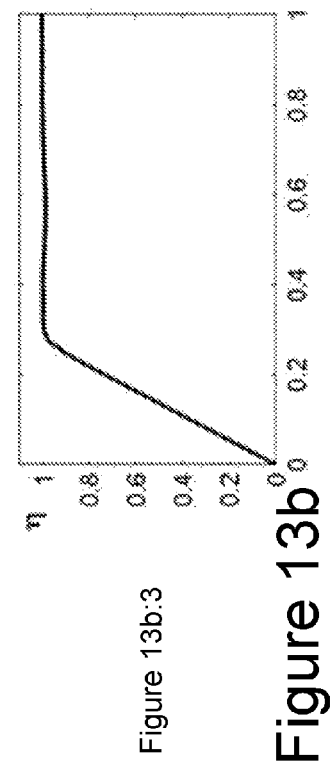
Figure 13C:
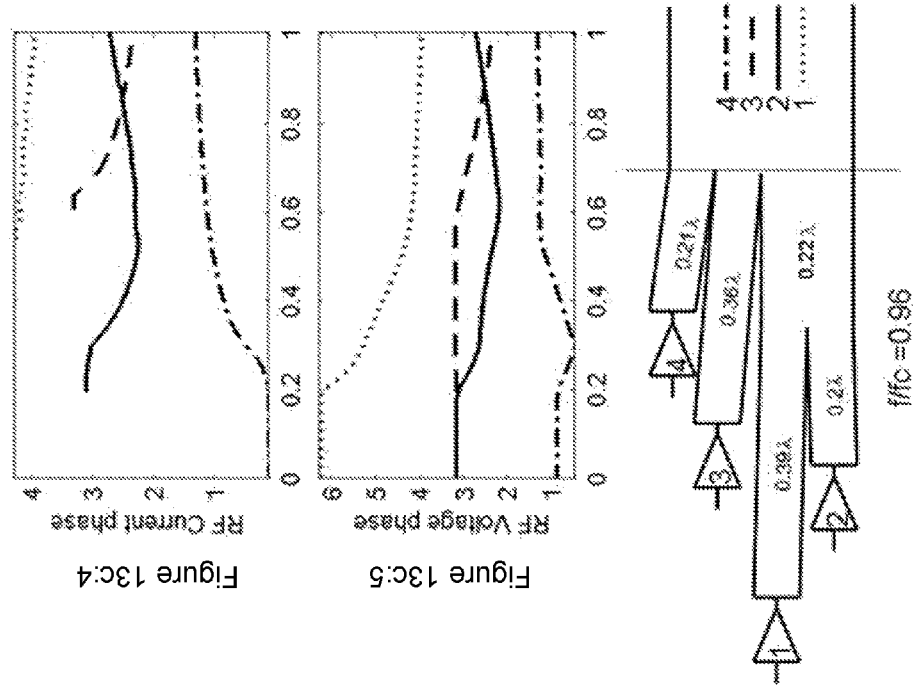
Figure 13C:
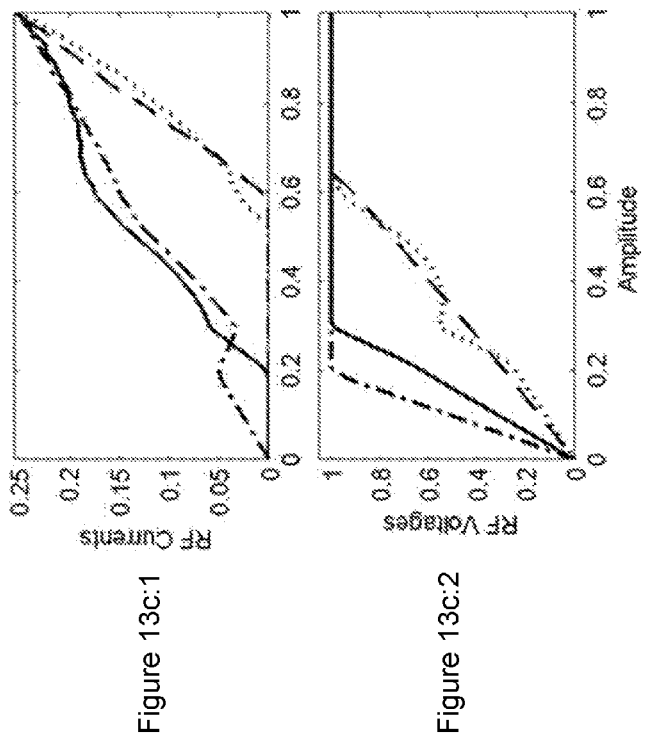
Figure 13C:
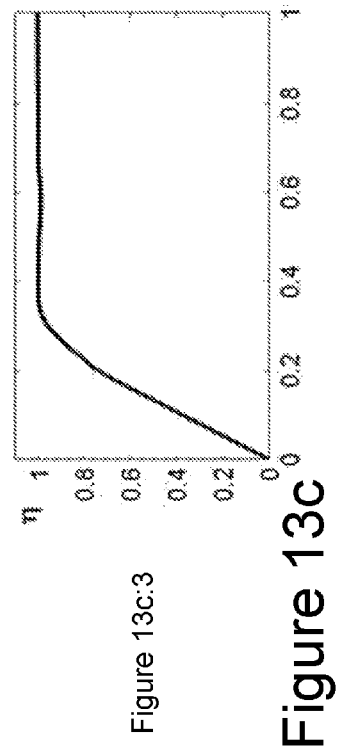
Figure 13D:
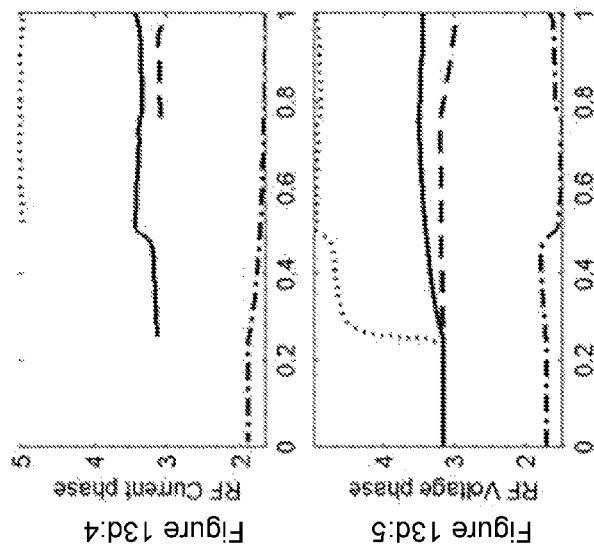
Figure 13D:
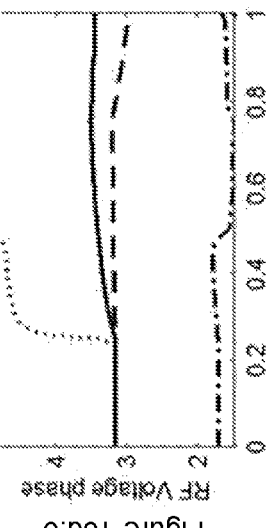
Figure 13D:
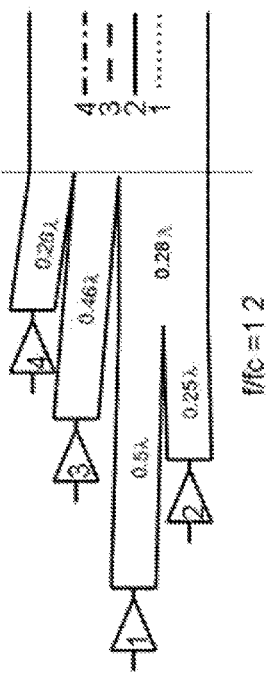
Figure 13D:
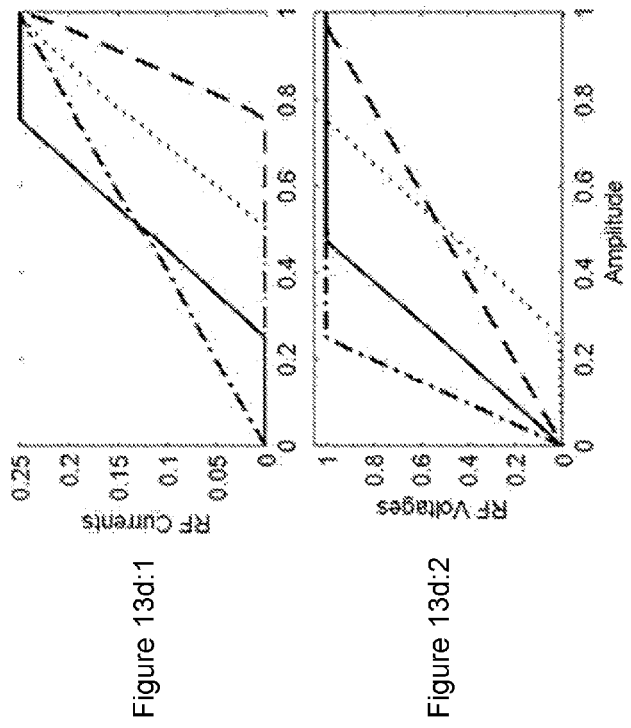
Figure 13D:
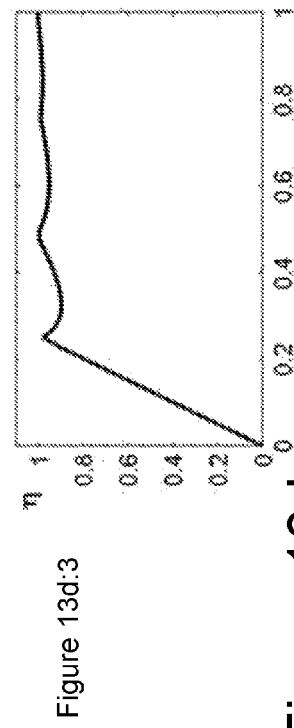
Figure 13E:
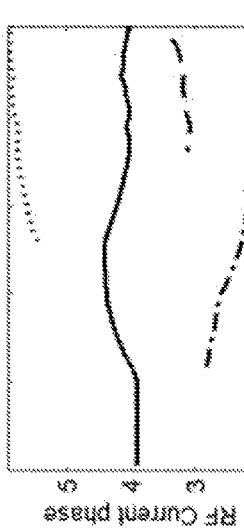
Figure 13E:
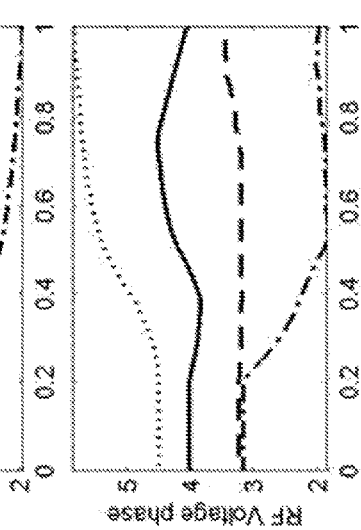
Figure 13E:
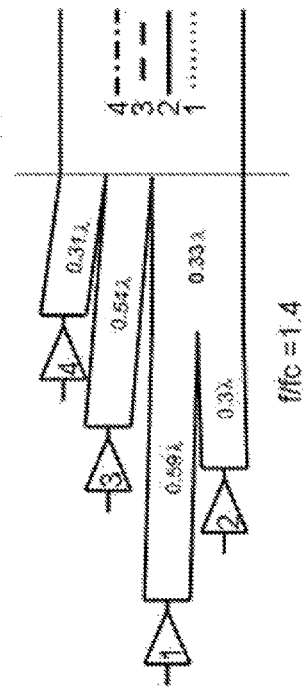
Figure 13E:
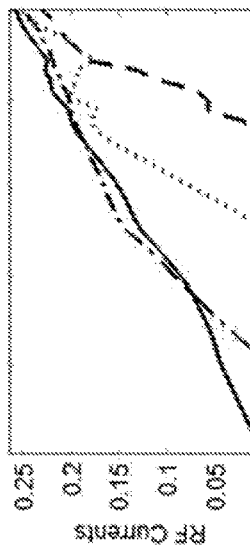
Figure 13E:
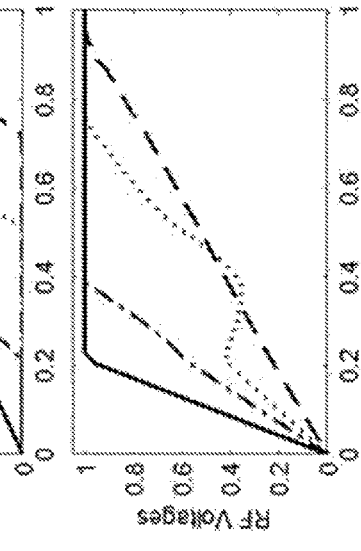
Figure 13E:
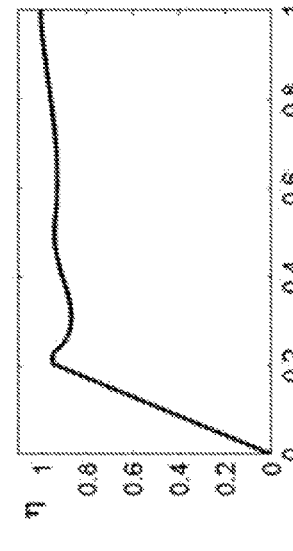

As a first 4-stage example with reference to FIG. 12, a trunk line, or common transmission line, from two of the transmission lines from the amplifiers is employed.

Examples of the operation at several frequencies within the 2.5 to 1 bandwidth (0.57 to 1.43 of center frequency) are shown in FIGS. 13a-13e.

FIG. 13a-13e show operation of the power amplifier of FIG. 12 at various frequencies within one half of the 2.5-to-1 bandwidth, starting at 0.57 of the center frequency. As with the previous example of a 3-stage amplifier, i.e. the power amplifier comprises three sub-amplifiers, this 4-stage amplifier uses different combinations of operating modes at different frequencies, and achieves good efficiency curves over the whole bandwidth. Similar observations as for FIGS. 5a-5d may be made here without further elaboration in detail.

Figure 14:
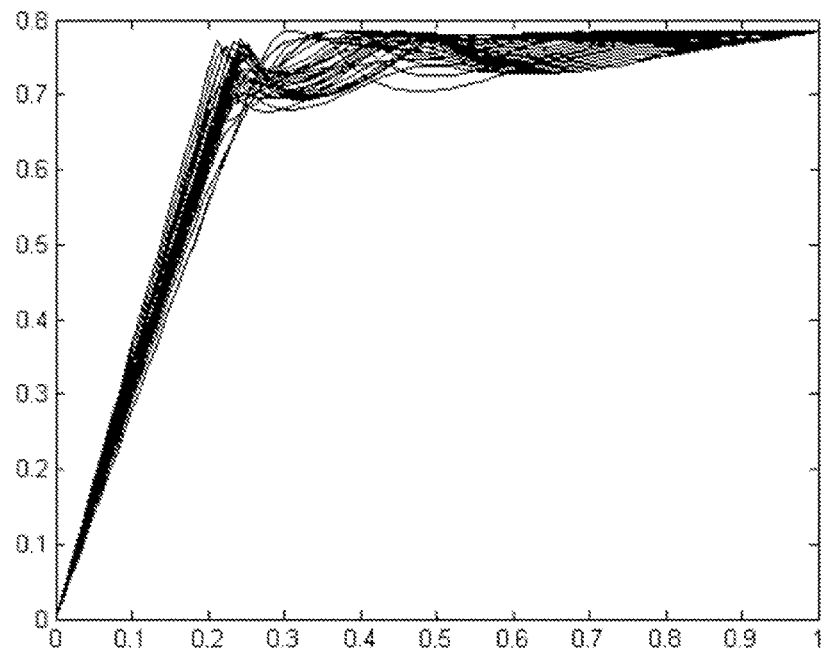
FIG. 14 is diagram illustrating efficiency versus amplitude for a range of frequencies.

In FIG. 14, a collection of efficiency curves are shown. All efficiency curves within the 2.5-to-1 bandwidth share the characteristics of quick efficiency increase with amplitude at low amplitudes and low ripple of the efficiency curve in the "plateau" region. Together this makes the power amplifier very efficient for high PAR signals within the whole bandwidth.

Figure 15:
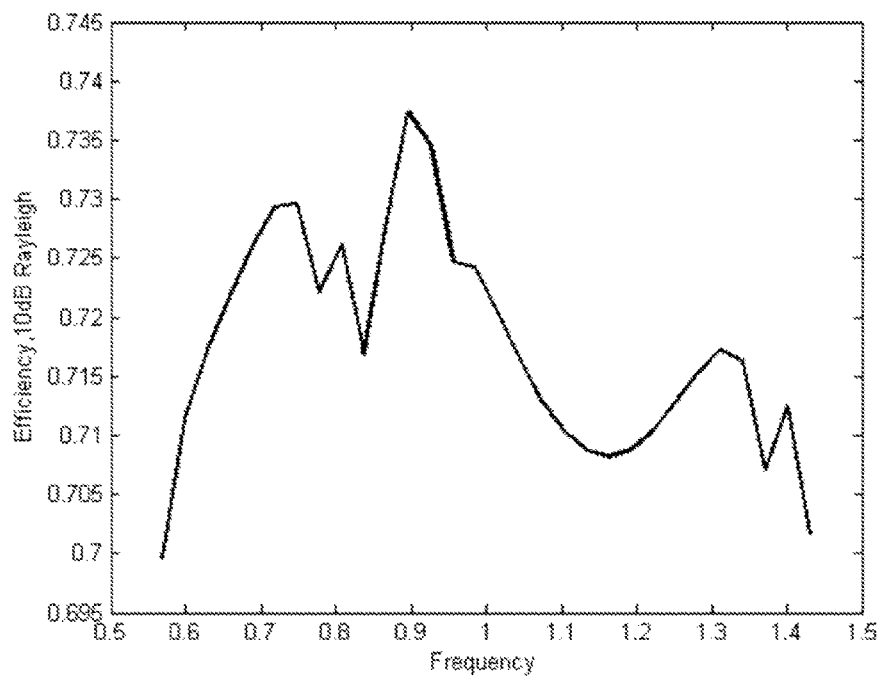
FIG. 15 illustrates efficiency versus frequency for other exemplifying power amplifiers for a signal with 10 dB PAR Rayleigh distributed amplitude.

In FIG. 15, a resulting average efficiency over frequency for 10 dB PAR Rayleigh signals is shown. The resulting average efficiency is over 70% as seen in the Figure.

Figure 16:
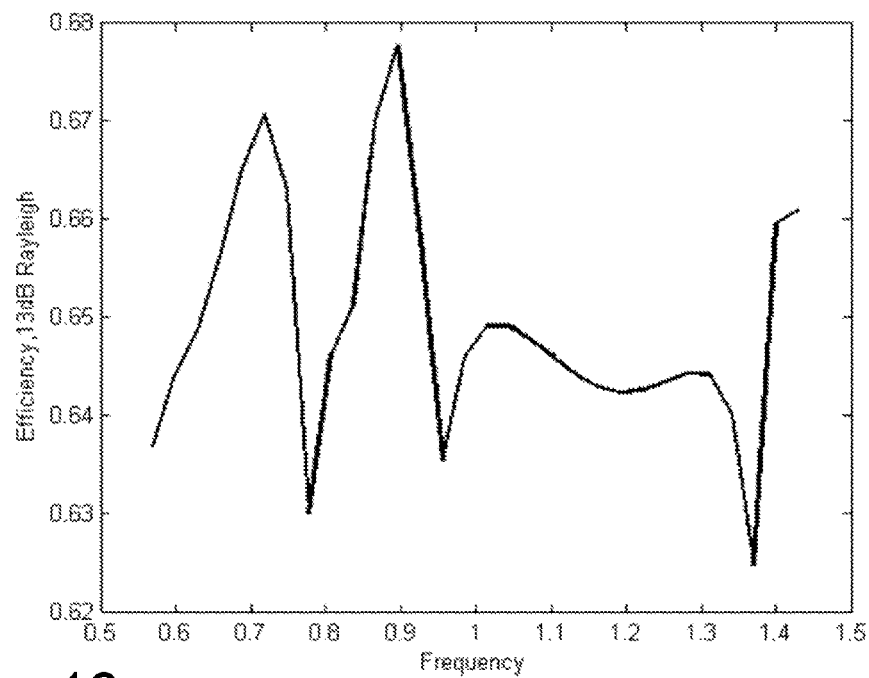
FIG. 16 illustrates efficiency versus frequency for other exemplifying power amplifiers for a signal with 13 dB PAR Rayleigh distributed amplitude.

The average efficiency for 13 dB PAR Rayleigh distributed amplitude signals is shown in FIG. 16 and is over 62%.

Figure 17:
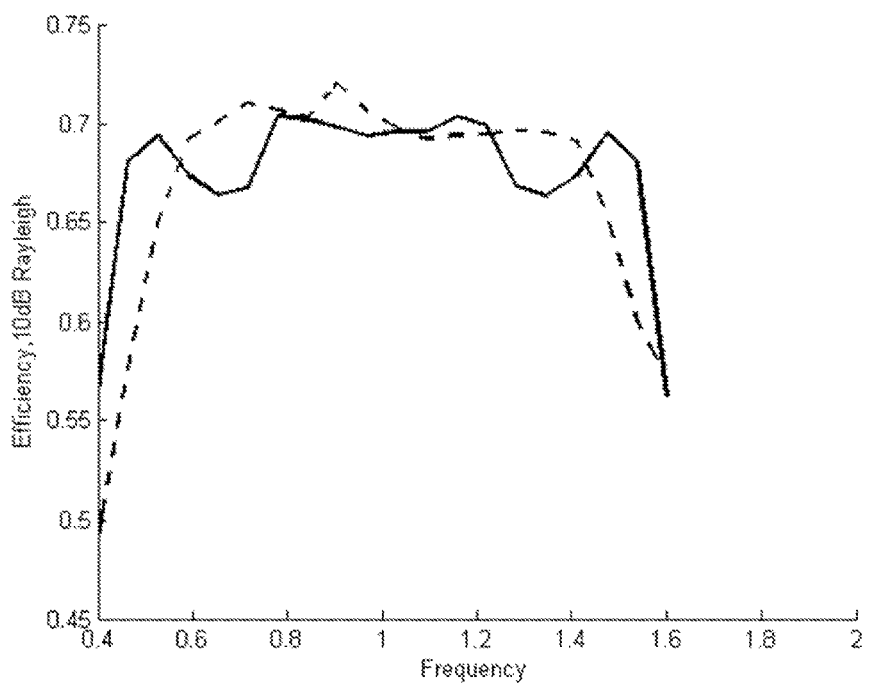
FIGS. 17 and 18 illustrate efficiency versus frequency for comparisons between some embodiments and an amplifier using quarter-wavelength transmission lines.
Figure 18:
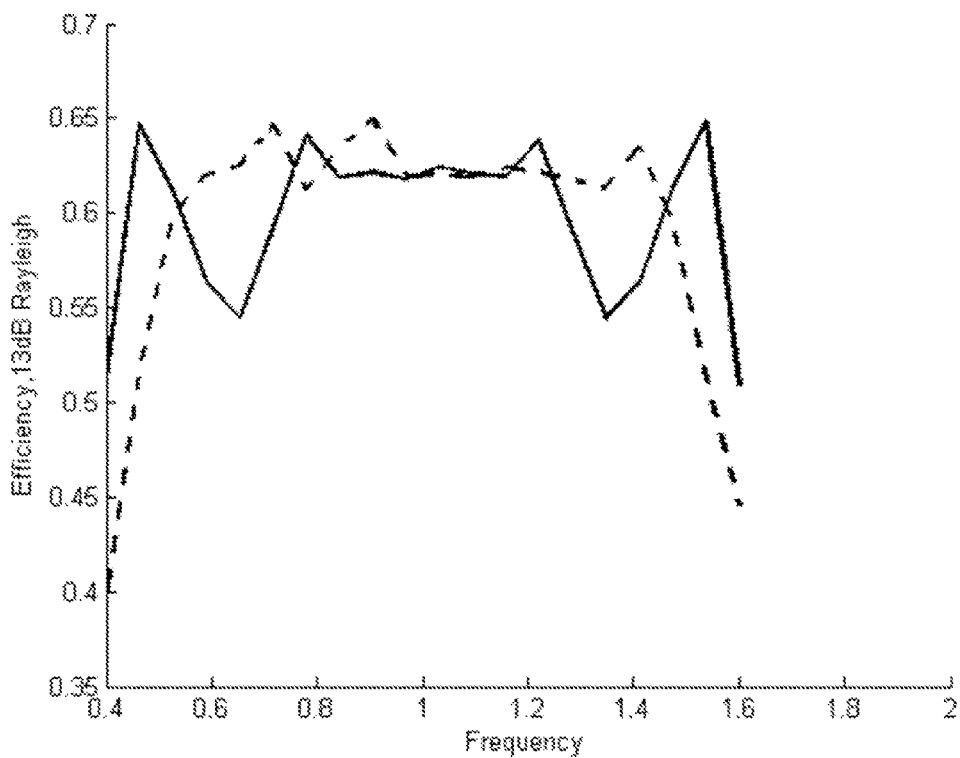

The power amplifier can be described in terms of a change to a prototype amplifier based only on multiples of quarter wavelength of transmission line. The average efficiency response for such prototype amplifier is shown as solid lines in FIGS. 17 and 18 for 10 dB and 13 dB Rayleigh distributed signals, respectively. In both cases, there are dips in efficiency—again see the solid lines. The dips are due to too low transimpedance to the output from the amplifiers in a Chireix pair. Chireix mode at low amplitudes involving primarily the first and third amplifiers in FIG. 13 at 0.57 of center frequency, see FIG. 13a. The transimpedance to the output from the third amplifier can at the lower of these frequencies be raised by shortening the transmission line from this amplifier to the common output by 15%, making this the new starting amplifier. In the nomenclature used herein, the sub-amplifier that is active (outputting RF current) in the lowest amplitude region is called the "starting" amplifier, regardless of what type of operation mode is involved. This is always the sub-amplifier with the highest transimpedance to the output, if the supply voltages and operation class are equal between sub-amplifiers. This shortening of the transmission line does not affect the rest of the operation much. Other adjustments have also been made, but are much smaller and have much smaller effect. To be centered at 1, the response is shifted upwards in frequency by scaling down all transmission line lengths. The new efficiency response is shown as dashed lines in FIGS. 17 and 18.

Figure 19:
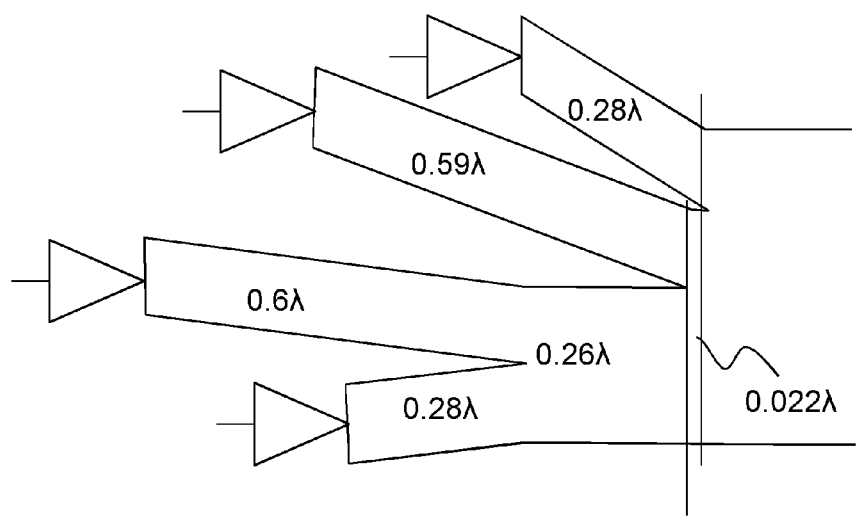
FIG. 19 is a further schematic simplified overview of the power amplifier according to some embodiments herein.
Figure 20:
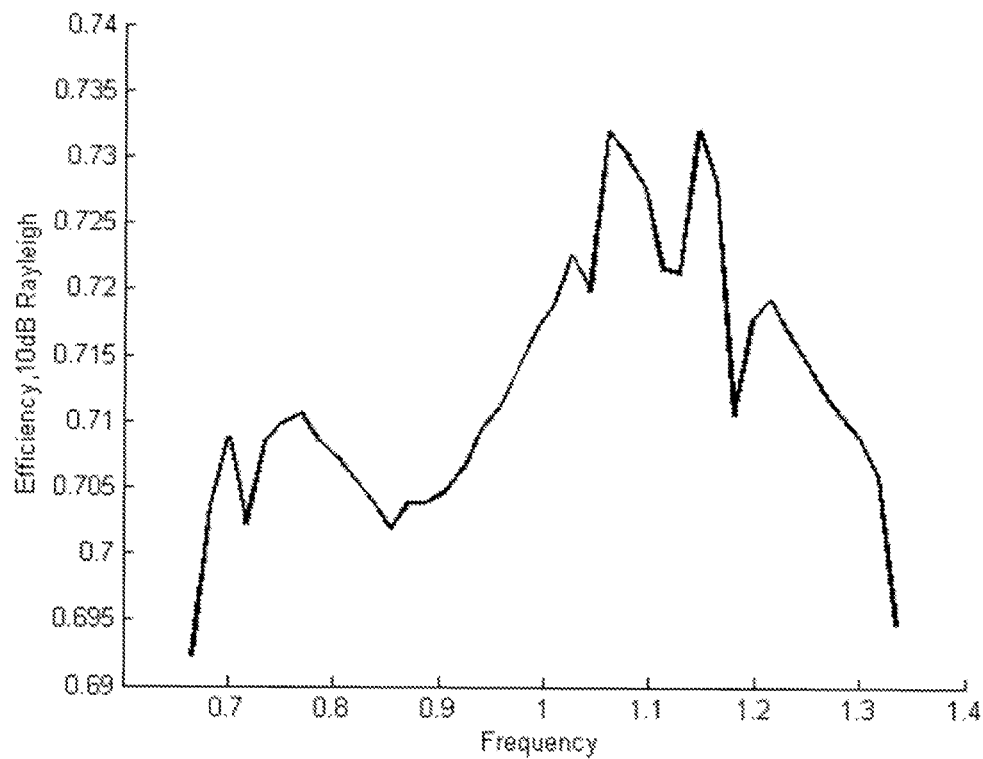
FIG. 20 illustrates efficiency versus frequency for further exemplifying power amplifiers for a signal with 10 dB PAR Rayleigh distributed amplitude.

Fixing the dip on the high side and shifting down the resulting response is also possible, but since the lower part of the original response is not used the relative bandwidth is lower, 2-to-1. The structure, efficiency curve collection over 2-to-1 bandwidth, and average efficiency versus frequency plots are shown in FIGS. 19 and 20.

Figure 21:
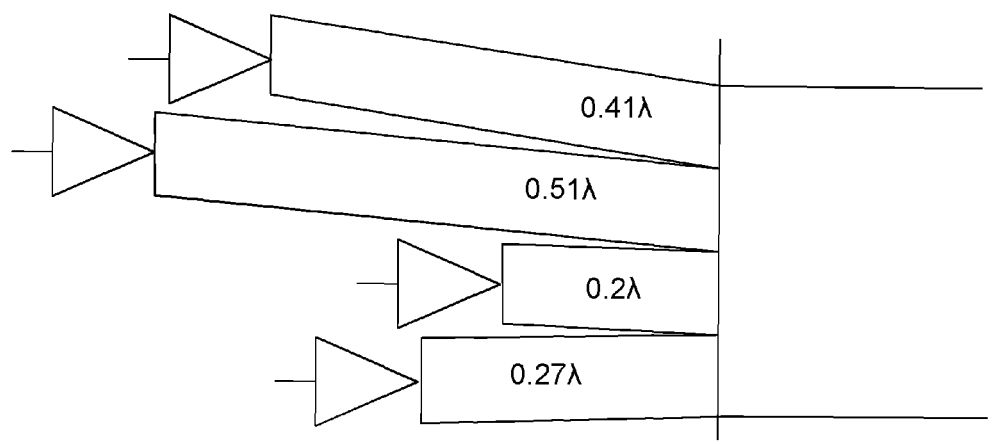
FIG. 21 is yet another schematic simplified overview of the power amplifier according to some embodiments herein.
Figure 22A:
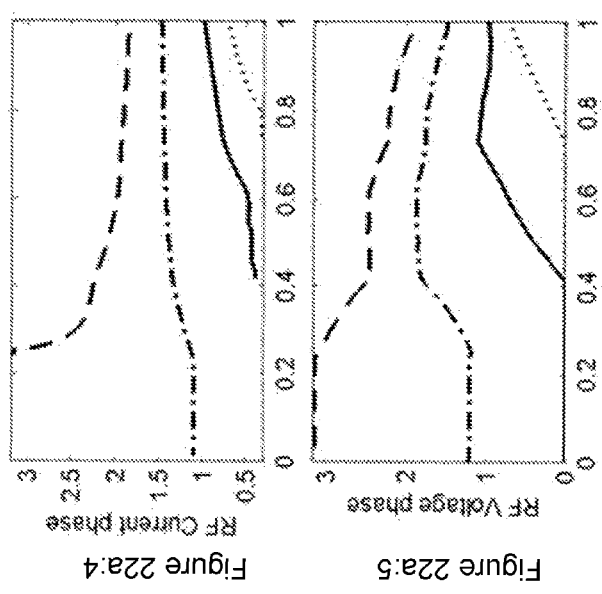
FIG. 22a-22e illustrate currents, voltages, and corresponding phases as well as amplitude for each of the sub-amplifiers for input signals at respective portion of the center frequency for yet another exemplifying power amplifier.
Figure 22A:
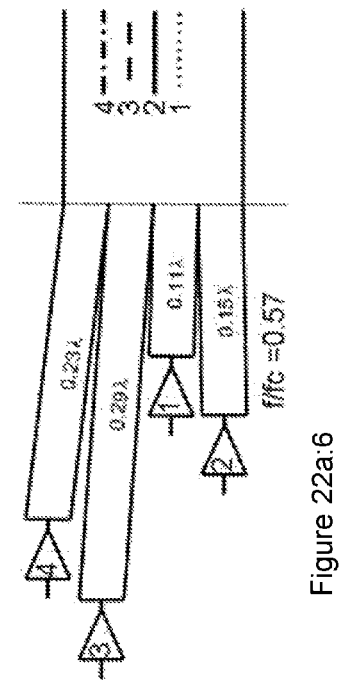
Figure 22A:
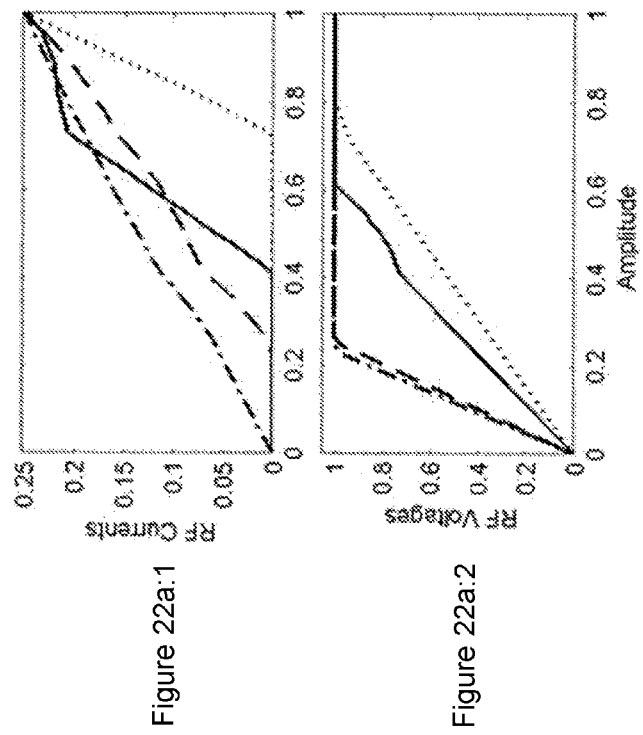
Figure 22B:
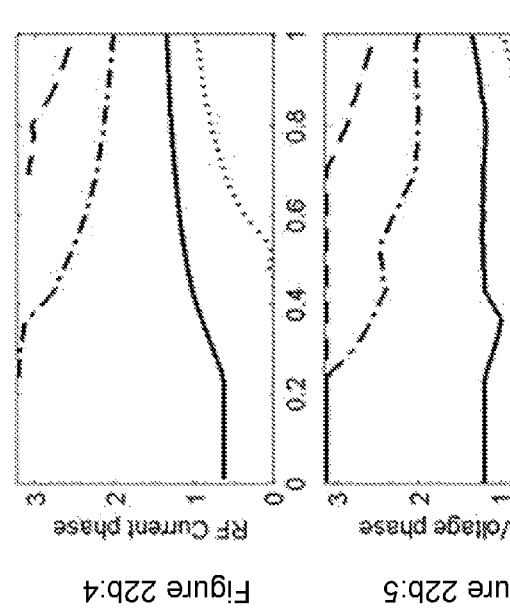
Figure 22B:
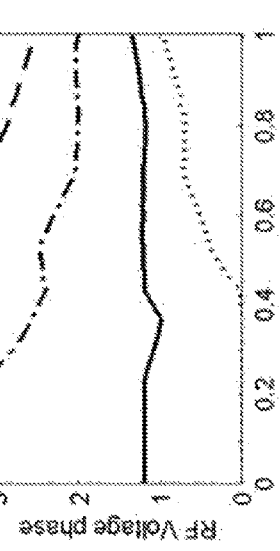
Figure 22B:
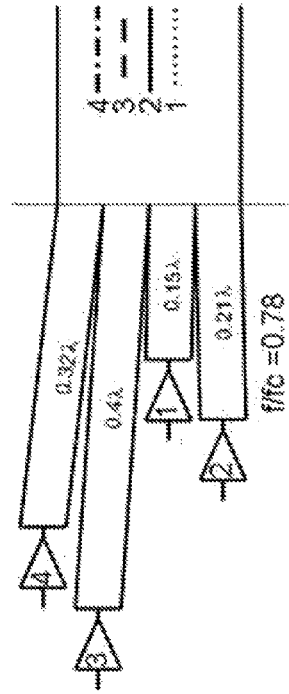
Figure 22B:
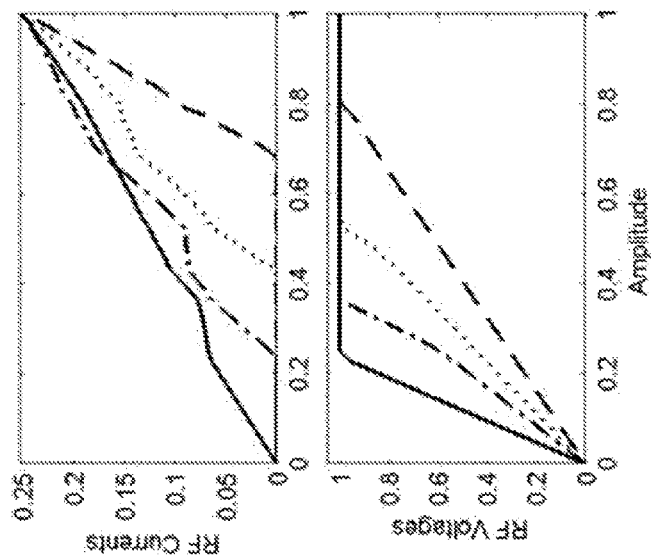
Figure 22B:
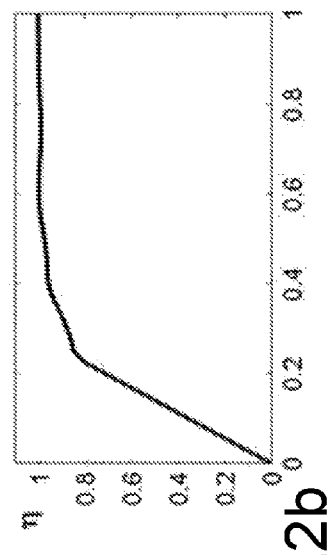
Figure 22C:
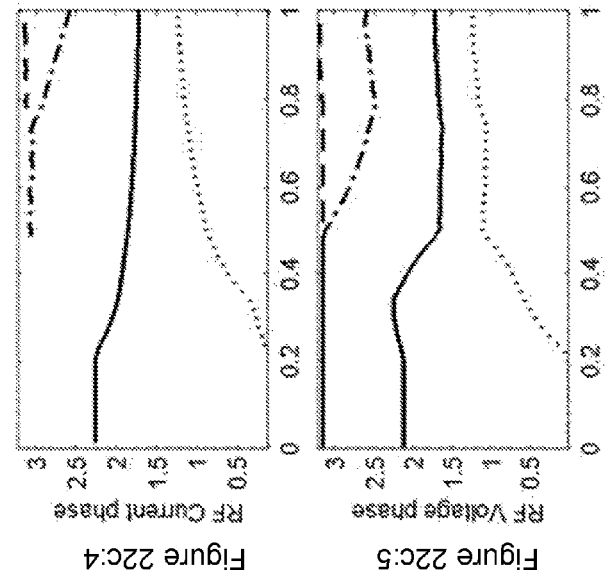
Figure 22C:
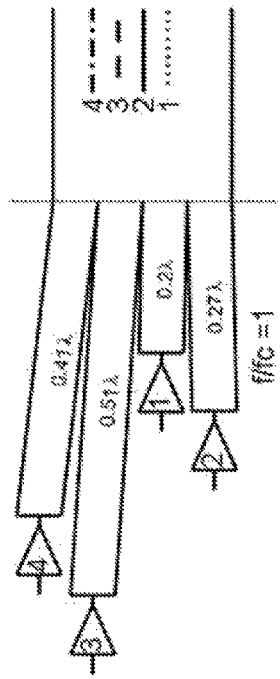
Figure 22C:
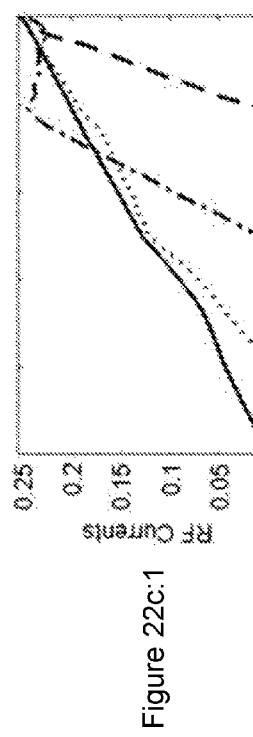
Figure 22C:
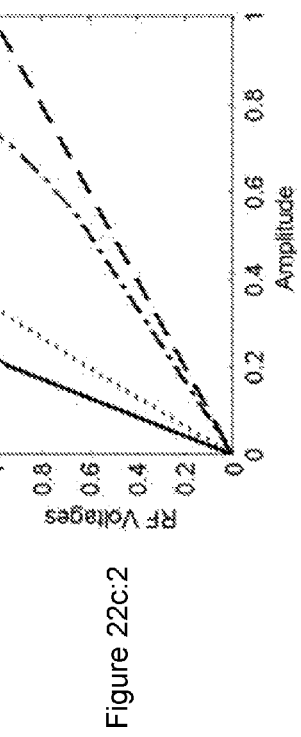
Figure 22C:
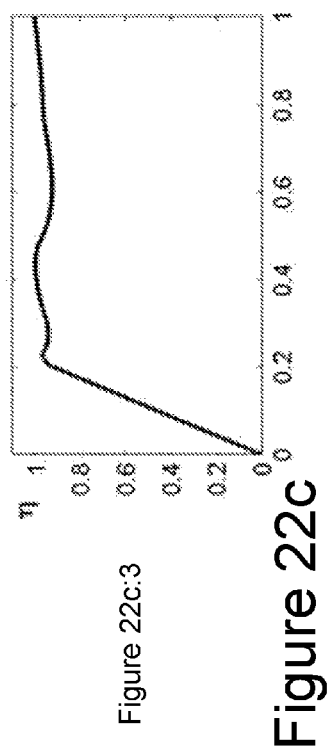
Figure 22D:
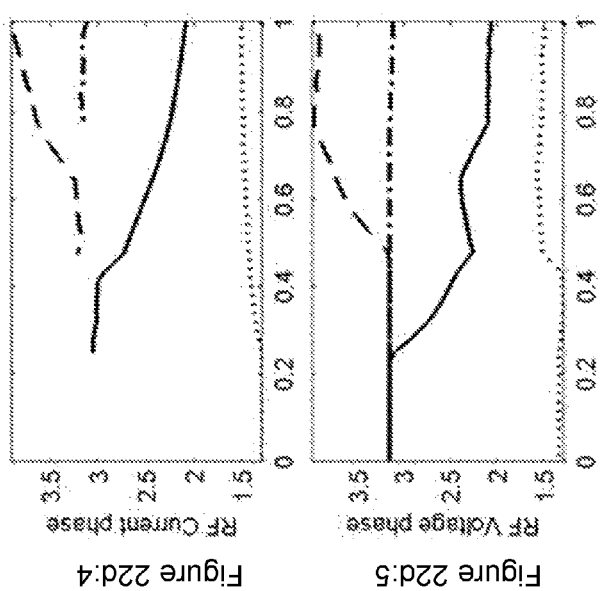
Figure 22D:
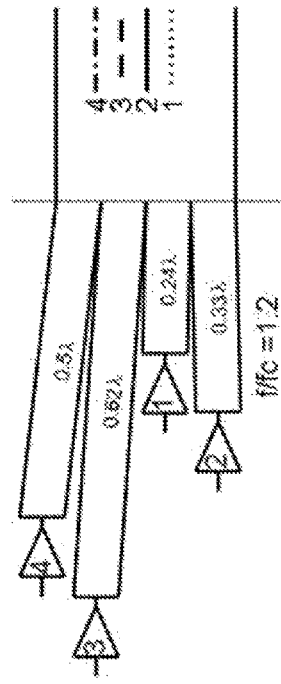
Figure 22D:
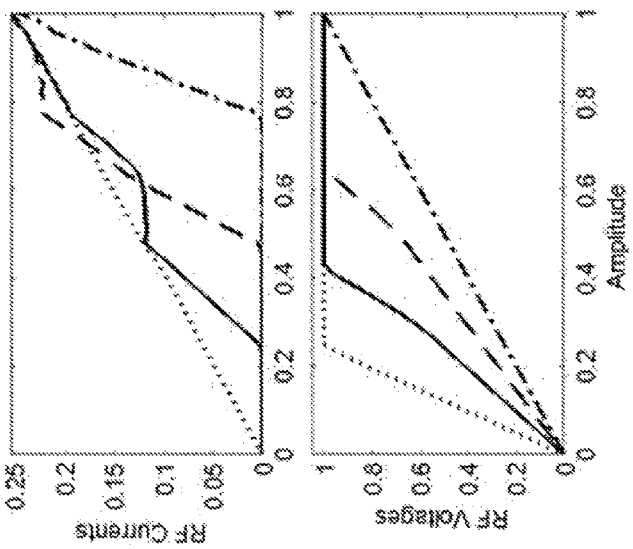
Figure 22E:
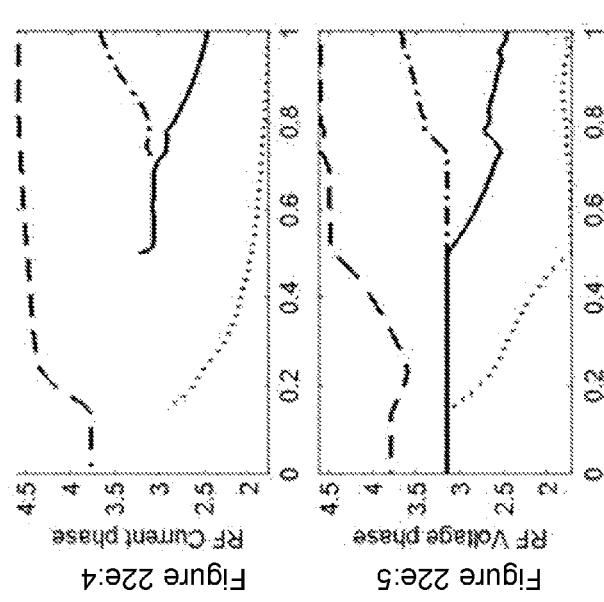
Figure 22E:
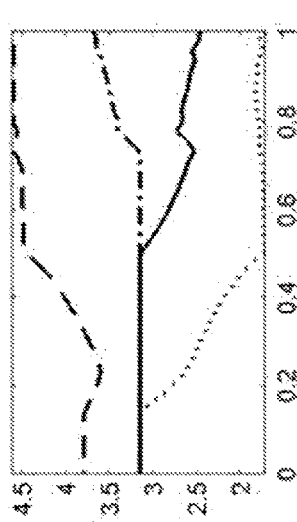
Figure 22E:
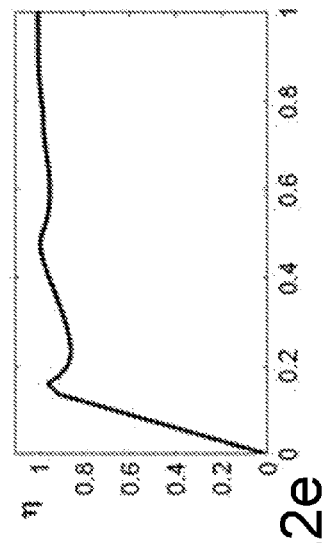
Figure 22E:
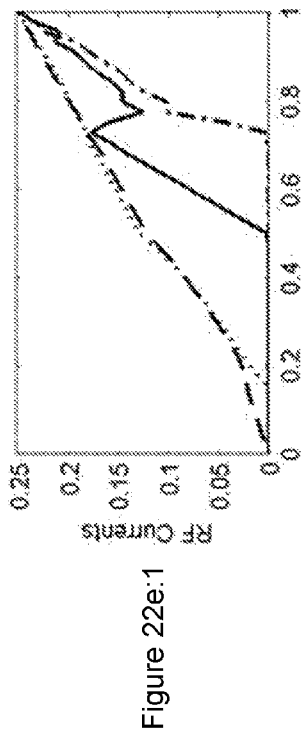
Figure 22E:
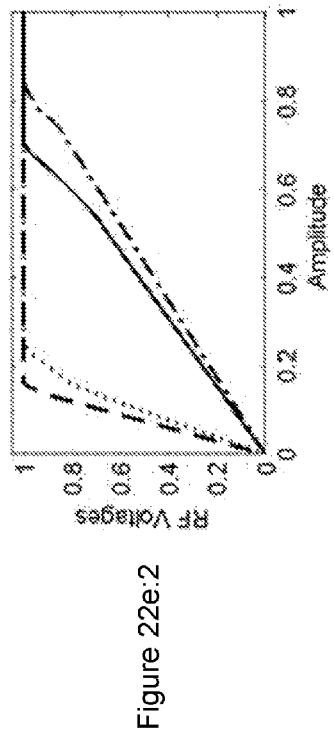
Figure 22E:
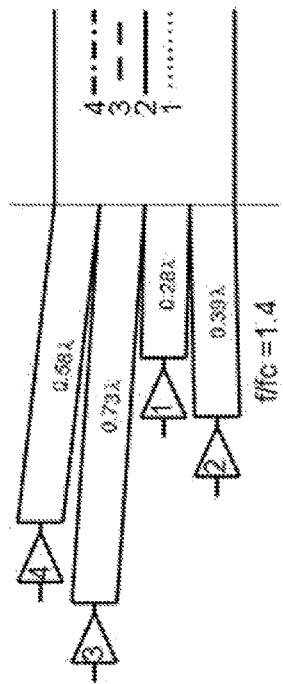

The final four-stage example, as shown in FIG. 21, is of an amplifier structure that is more like the first three-stage amplifier example in that all transmission lines from the sub-amplifiers connect directly to the output. The structure is shown below. With this power amplifier, there is as much at least partial Chireix operation as possible.

Examples of the operation at several frequencies within the 2.5 to 1 bandwidth (0.57 to 1.43 of c enter frequency) are shown in FIGS. 22a to 22e, together with the resulting efficiency curve and the electrical lengths of the output network structure.

FIG. 22a-22e show operation of the power amplifier of FIG. 21 at various frequencies within one half of the 2.5-to-1 bandwidth, starting at 0.57 of the center frequency. As with the previous example of a 3-stage amplifier, i.e. the power amplifier comprises three sub-amplifiers, this 4-stage amplifier uses different combinations of operating modes at different frequencies, and achieves good efficiency curves over the whole bandwidth. Similar observations as for FIGS. 5a-5d may be made here without further elaboration in detail.

Figure 23:
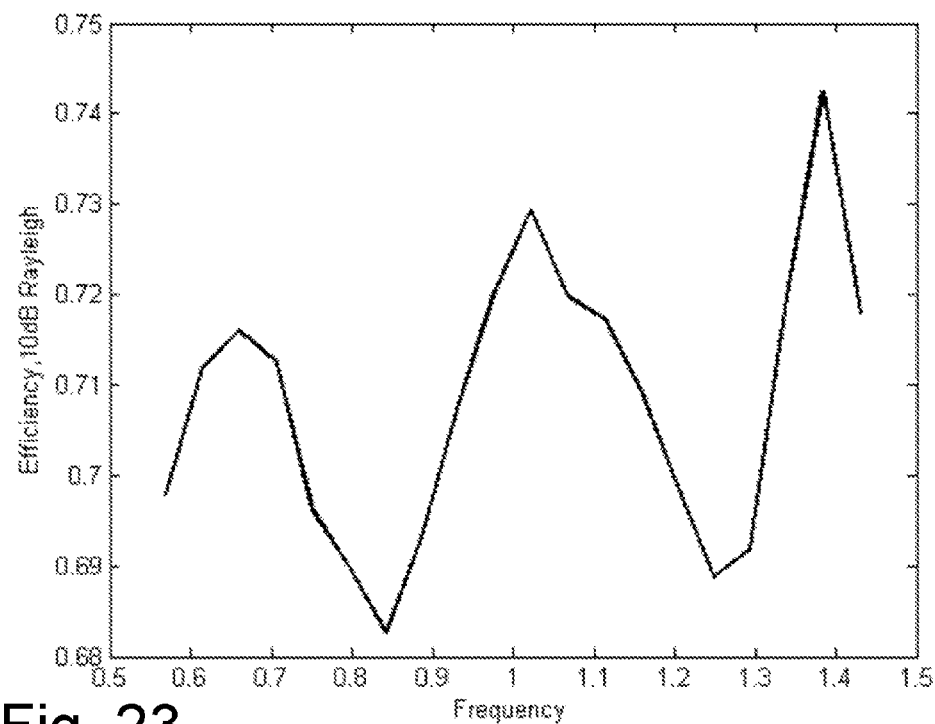
FIG. 23 illustrates efficiency versus frequency for other exemplifying power amplifiers for a signal with 10 dB PAR Rayleigh distributed amplitude.

The resulting average efficiency, e.g. theoretical efficiency with the sub-amplifiers in class B operation, over frequency for 10 dB PAR Rayleigh signals is shown in FIG. 23 and is over 68%.

Figure 24:
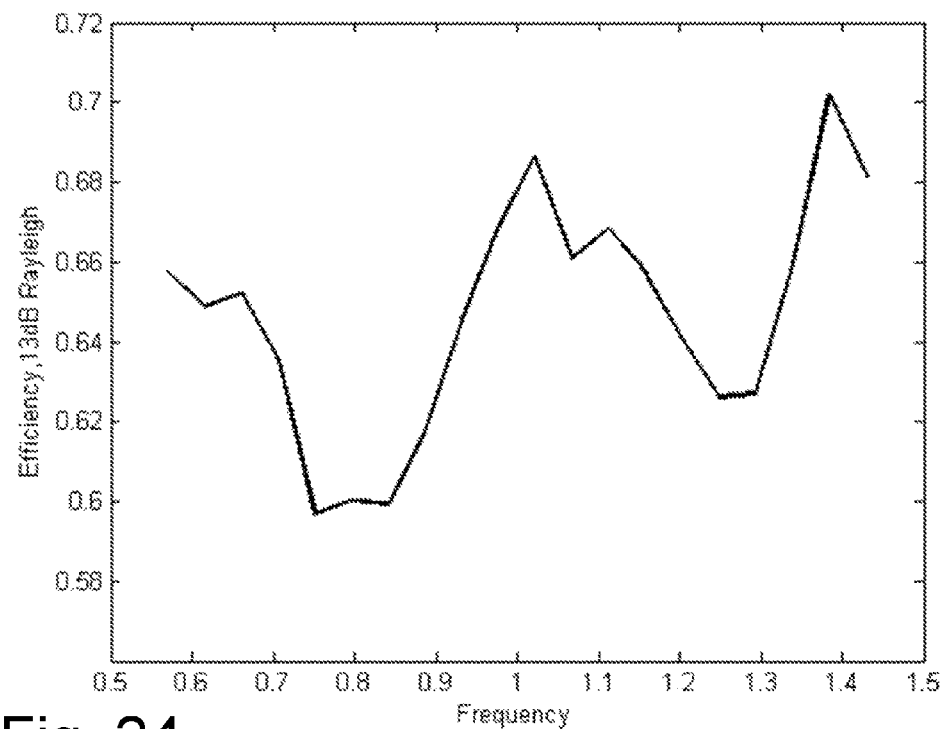
FIG. 24 illustrates efficiency versus frequency for other exemplifying power amplifiers for a signal with 13 dB PAR Rayleigh distributed amplitude.

The average efficiency for 13 dB PAR Rayleigh distributed amplitude signals is shown in FIG. 24 and is over 60%.

Figure 25:
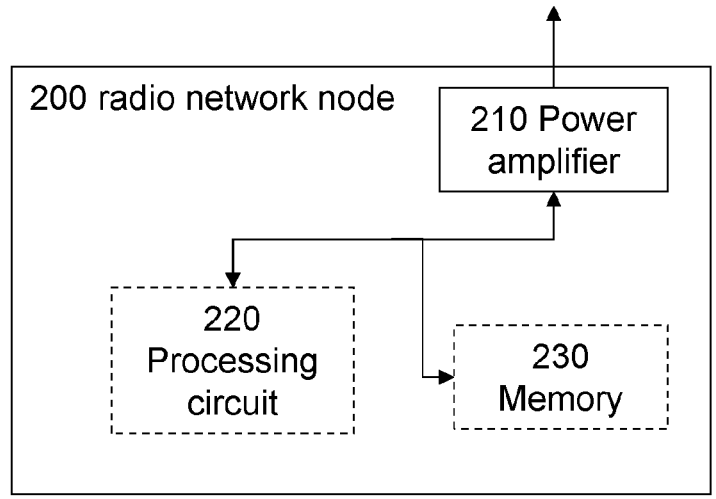
FIG. 25 illustrates an exemplifying radio network node according to embodiments herein.

FIG. 25 shows an exemplifying radio network node 200.

As used herein, the term "radio network node" may refer to is a piece of equipment that facilitates wireless communication between user equipment (UE) and a network. Accordingly, the term "radio network node" may refer to a Base Station (BS), a Base Transceiver Station (BTS), a Radio Base Station (RBS), a NodeB in so called Third Generation (3G) networks, evolved Node B, eNodeB or eNB in Long Term Evolution (LTE) networks, or the like. In UMTS Terrestrial Radio Access Network (UTRAN) networks, where UTMS is short for Universal Mobile Telecommunications System, the term "radio network node" may also refer to a Radio Network Controller. Furthermore, in Global System for Mobile Communications (GSM) EDGE Radio Access Network (GERAN), where EDGE is short for Enhanced Data rates for GSM Evolution, the term "radio network node" may also refer to a Base Station Controller (BSC).

The radio network node 200 comprises a power amplifier 210, e.g. the power amplifier 100, according to the embodiments described above.

Furthermore, the radio network node 200 may comprise a processing circuit 220 and/or a memory 230.

The radio network node 200 may further comprise additional transceiver circuitry (not shown) for facilitating transmission and reception of data, e.g. in the form of radio signals.

Figure 26:
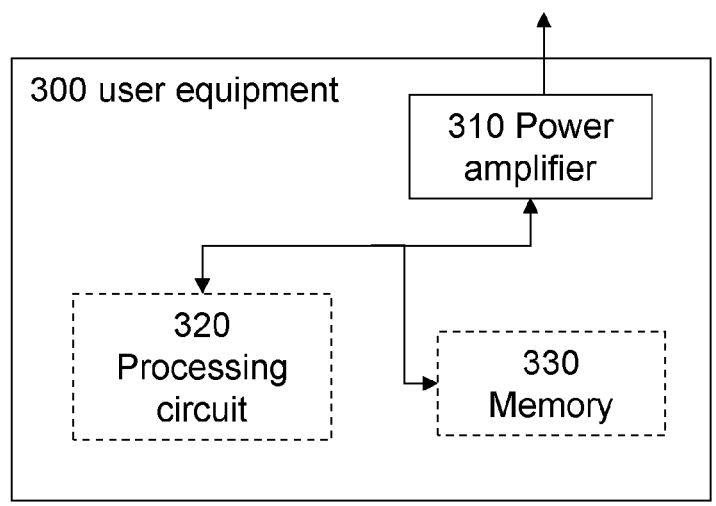
FIG. 26 illustrates an exemplifying user equipment according to embodiments herein.

FIG. 26 shows an exemplifying user equipment 300.

As used herein, the term "user equipment" may refer to a mobile phone, a cellular phone, a Personal Digital Assistant (PDA) equipped with radio communication capabilities, a smartphone, a laptop or personal computer (PC) equipped with an internal or external mobile broadband modem, a tablet PC with radio communication capabilities, a portable electronic radio communication device, a sensor device equipped with radio communication capabilities or the like. The sensor may be any kind of weather sensor, such as wind, temperature, air pressure, humidity etc. As further examples, the sensor may be a light sensor, an electronic switch, a microphone, a loudspeaker, a camera sensor etc.

The user equipment 300 comprises a power amplifier 310, e.g. the power amplifier 100, according to the embodiments described above.

Furthermore, the user equipment 300 may comprise a processing circuit 320 and/or a memory 330. The means of the terms "processing circuit" and "memory" as explained above applies also for the user equipment 300.

The user equipment 300 may further comprise additional transceiver circuitry (not shown) for facilitating transmission and reception of data, e.g. in the form of radio signals.

As used herein, the term "processing circuit" may be a processing unit, a processor, an application specific integrated circuit (ASIC), a field-programmable gate array (FPGA) or the like. As an example, a processor, an ASIC, an FPGA or the like may comprise one or more processor kernels. In some examples, the processing circuit may be embodied by a software or hardware module. Any such module may be a determining means, estimating means, capturing means, associating means, comparing means, identification means, selecting means, receiving means, transmitting means or the like as disclosed herein. As an example, the expression "means" may be a unit, such as a determining unit, selecting unit, etc.

As used herein, the term "memory" may refer to a hard disk, a magnetic storage medium, a portable computer diskette or disc, flash memory, random access memory (RAM) or the like. Furthermore, the term "memory" may refer to an internal register memory of a processor or the like.

As used herein, the terms "number", "value" may be any kind of digit, such as binary, real, imaginary or rational number or the like. Moreover, "number", "value" may be one or more characters, such as a letter or a string of letters. "number", "value" may also be represented by a bit string.

As used herein, the expression "in some embodiments" has been used to indicate that the features of the embodiment described may be combined with any other embodiment disclosed herein.

Even though embodiments of the various aspects have been described, many different alterations, modifications and the like thereof will become apparent for those skilled in the art. The described embodiments are therefore not intended to limit the scope of the present disclosure.

The invention claimed is:

1. A power amplifier comprising a first and a second sub-amplifier for amplification of an input signal into an output signal, wherein the first and second sub-amplifiers are connected to an input network for receiving the input signal at an input port of the input network, and the first and second sub-amplifiers are connected to an output network for providing the output signal at an output port of the output network, wherein the output network comprises a first transmission line and a second transmission line connected to the first sub-amplifier and the second sub-amplifier, respectively, wherein the power amplifier further comprises:

a third sub-amplifier for amplification of the input signal into the output signal, wherein the third sub-amplifier is connected to the input network and the output network, wherein the output network further comprises a third transmission line connected to the third sub-amplifier, wherein the first and second sub-amplifiers are operable in a first mode at a first frequency range, wherein the second and third sub-amplifiers are operable in a second mode at a second frequency range, and wherein the first and third sub-amplifiers are operable in a third mode at a third frequency range, wherein the sub-amplifiers in each of the first, second and third modes are operating at maximum voltage in a respective part of an amplitude range of the power amplifier, for which a change in their combined output depends only on change in phase difference between the respective two amplifiers.

2. The power amplifier according to claim 1, wherein the first and second transmission lines are connected to a first common transmission line, included in the output network, wherein the first common transmission line is common to the first and second sub-amplifiers.

3. The power amplifier according to claim 1, further comprising a fourth sub-amplifier, wherein the fourth sub-amplifier is connected to the input network and the output network, wherein the output network further comprises a fourth transmission line.

4. The power amplifier according to claim 3, wherein the third and fourth sub-amplifiers are connected to a second common transmission line, included in the output network, wherein the second common transmission line is common to the third and fourth sub-amplifiers.

5. The power amplifier according to claim 1, wherein the power amplifier is a composite power amplifier.

6. A radio network node comprising the power amplifier according to claim 1.

7. A user equipment comprising the power amplifier according to claim 1.

8. A power amplifier comprising a first and a second sub-amplifier for amplification of an input signal into an output signal, wherein the first and second sub-amplifiers are connected to an input network for receiving the input signal at an input port of the input network, and the first and second sub-amplifiers are connected to an output network for providing the output signal at an output port of the output network, wherein the output network comprises a first transmission line and a second transmission line connected to the first sub-amplifier and the second sub-amplifier, respectively, wherein the power amplifier further comprises:

a third sub-amplifier for amplification of the input signal into the output signal, wherein the third sub-amplifier is connected to the input network and the output network, wherein the output network further comprises a third transmission line connected to the third sub-amplifier, wherein the first and second sub-amplifiers are operable in a first mode, wherein the second and third sub-amplifiers are operable in a second mode, and wherein the first and third sub-amplifiers are operable in a third mode, wherein each of the first, second and third modes comprises a respective out-phasing mode in a respective part of an amplitude range of the power amplifier, wherein each of the first, second and third modes is different from a pure Doherty mode across an operational bandwidth of the power amplifier.

* * * * *